(12) United States Patent
Koduri

(10) Patent No.: US 11,791,248 B2
(45) Date of Patent: Oct. 17, 2023

(54) COATED SEMICONDUCTOR DEVICES

(71) Applicant: Texas Instruments Incorporated, Dallas, TX (US)

(72) Inventor: Sreenivasan Kalyani Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/152,733

(22) Filed: Jan. 10, 2023

(65) Prior Publication Data

US 2023/0163050 A1 May 25, 2023

Related U.S. Application Data

(63) Continuation of application No. 16/936,290, filed on Jul. 22, 2020, now Pat. No. 11,552,006.

(51) Int. Cl.
*H01L 21/48* (2006.01)
*H01L 23/495* (2006.01)
*H01L 23/31* (2006.01)
*H01L 21/56* (2006.01)
*H05K 1/18* (2006.01)
*H01L 23/552* (2006.01)
*H05K 3/34* (2006.01)

(52) U.S. Cl.
CPC .......... *H01L 21/4821* (2013.01); *H01L 21/56* (2013.01); *H01L 23/3135* (2013.01); *H01L 23/49555* (2013.01); *H01L 23/49558* (2013.01); *H01L 23/552* (2013.01); *H05K 1/181* (2013.01); *H05K 3/3426* (2013.01); *H01L 21/4842* (2013.01); *H01L 23/49586* (2013.01); *H05K 2201/10931* (2013.01)

(58) Field of Classification Search
CPC ............. H01L 21/4821; H01L 21/4828; H01L 21/4835; H01L 23/49558; H01L 21/56; H01L 23/3135; H01L 23/49555; H01L 23/552; H01L 21/4842; H01L 23/49586
See application file for complete search history.

(56) References Cited

U.S. PATENT DOCUMENTS

| | | |
|---|---|---|
| 5,289,344 A | 2/1994 | Gagnon et al. |
| 5,302,553 A | 4/1994 | Abbott et al. |
| 5,825,042 A | 10/1998 | Strobel et al. |
| 5,864,088 A | 1/1999 | Sato et al. |
| 6,368,899 B1 * | 4/2002 | Featherby ............... H01L 24/48 257/E23.126 |
| 6,455,864 B1 | 9/2002 | Featherby et al. |
| 8,633,506 B2 | 1/2014 | Kobayakawa et al. |
| 9,955,590 B2 | 4/2018 | Weng |
| 10,373,897 B2 | 8/2019 | Otremba et al. |
| 11,552,006 B2 * | 1/2023 | Koduri ................. H01L 23/552 |
| 2002/0047187 A1 | 4/2002 | Nakajima et al. |
| 2008/0017999 A1 * | 1/2008 | Kikuchi ............. H01L 23/3128 257/E23.056 |

(Continued)

*Primary Examiner* — Eduardo A Rodela
(74) *Attorney, Agent, or Firm* — Dawn Jos; Frank D. Cimino

(57) ABSTRACT

In examples, a semiconductor device comprises a semiconductor die, an opaque mold compound housing covering the semiconductor die, a conductive terminal extending from the mold compound housing, and an insulative coat covering the mold compound housing and at least a portion of the conductive terminal.

9 Claims, 18 Drawing Sheets

(56) References Cited

U.S. PATENT DOCUMENTS

| | | |
|---|---|---|
| 2008/0073794 A1 | 3/2008 | Obata et al. |
| 2010/0127362 A1 | 5/2010 | Fan et al. |
| 2015/0235927 A1 | 8/2015 | Bauer et al. |
| 2018/0005926 A1 | 1/2018 | Iwai et al. |
| 2018/0082977 A1 | 3/2018 | Yagyu |
| 2021/0108091 A1 | 4/2021 | Cunningham et al. |
| 2021/0327777 A1 | 10/2021 | Iwai et al. |

* cited by examiner

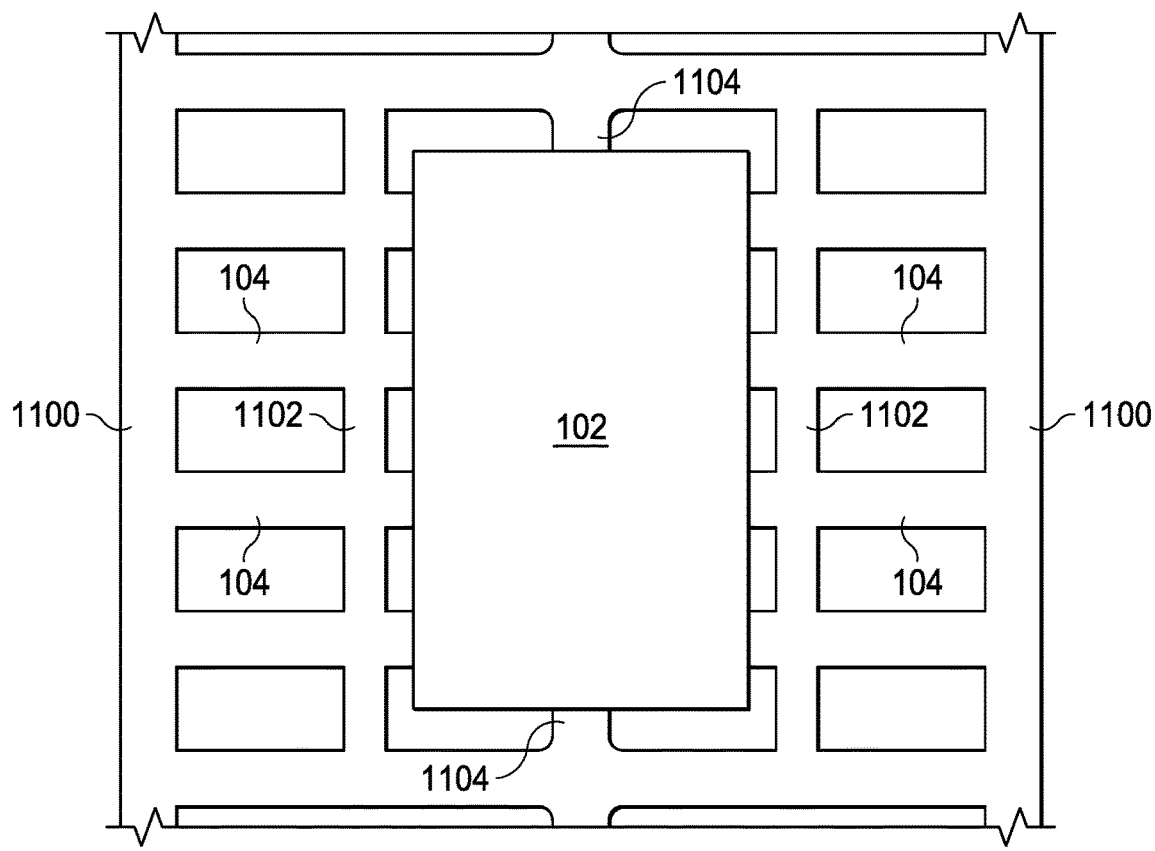
FIG. 11A1
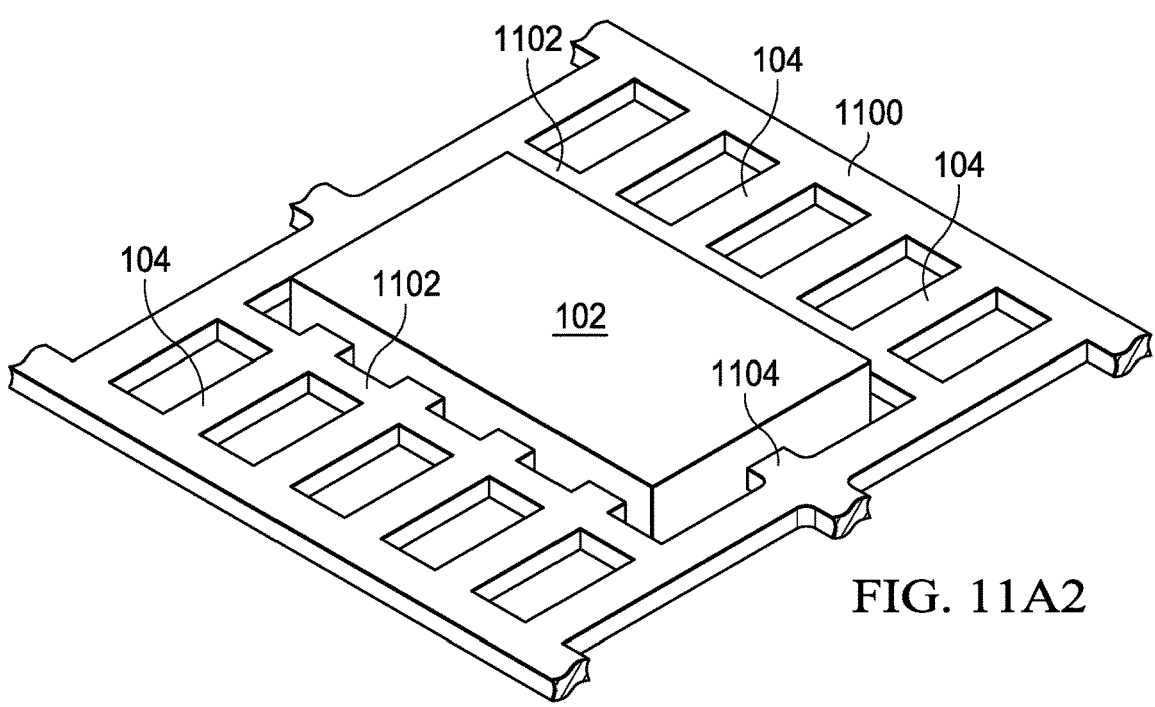
FIG. 11A2

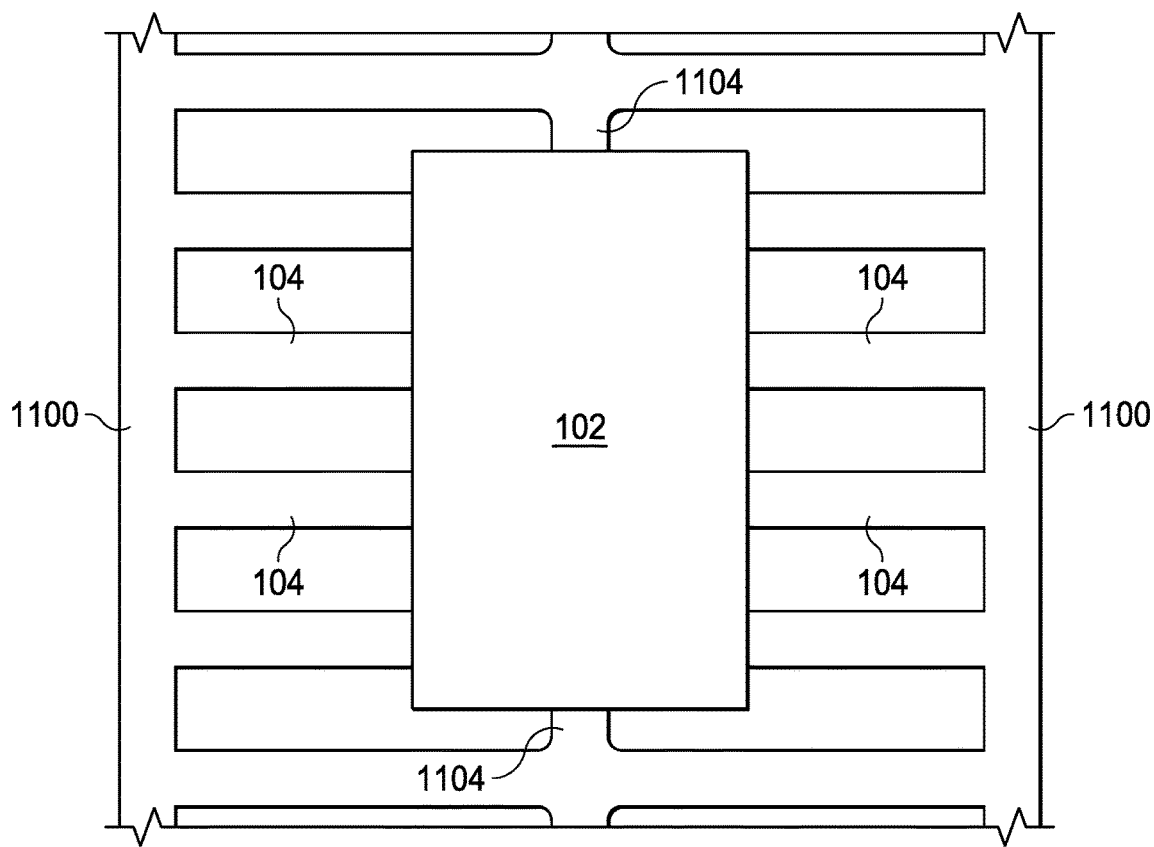
FIG. 11B1
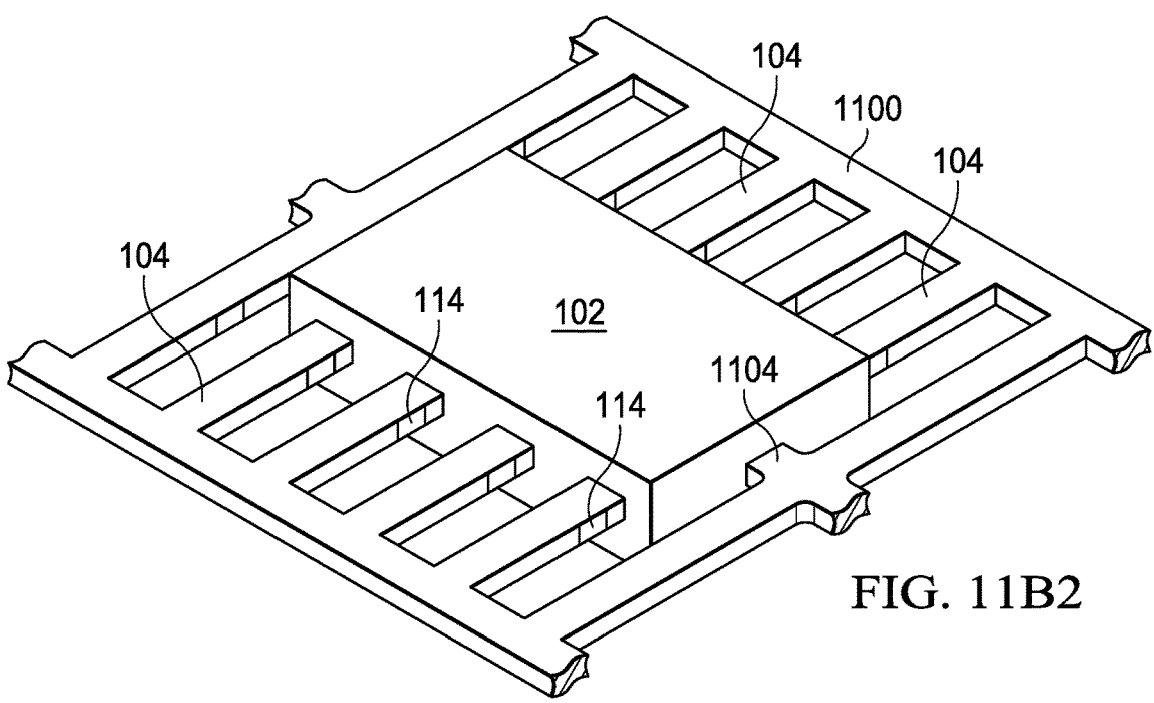
FIG. 11B2

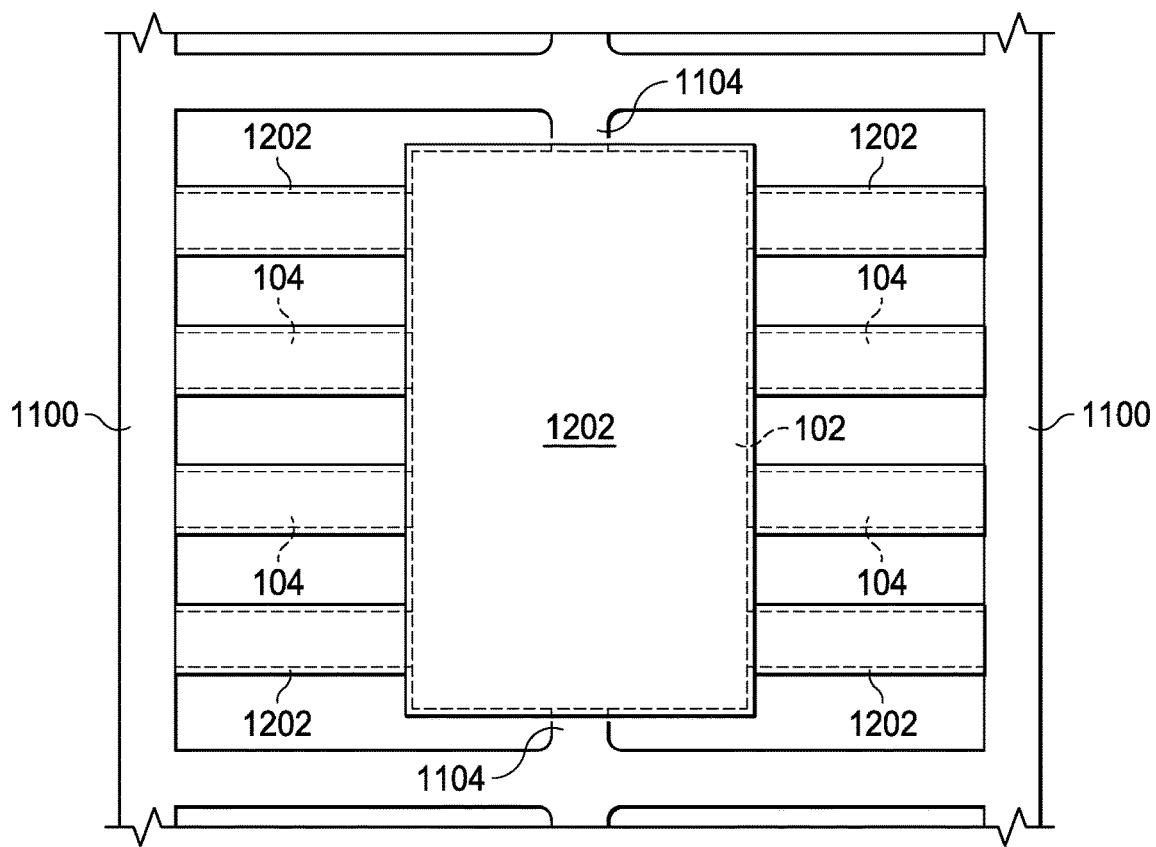
FIG. 11C1
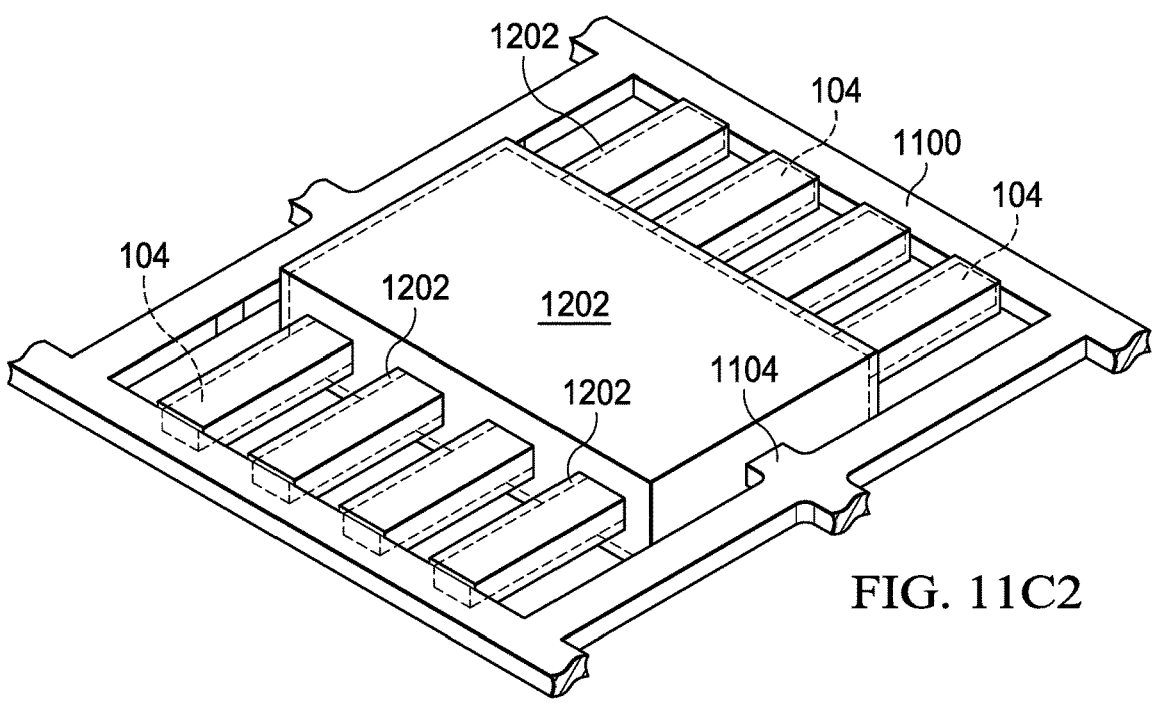
FIG. 11C2

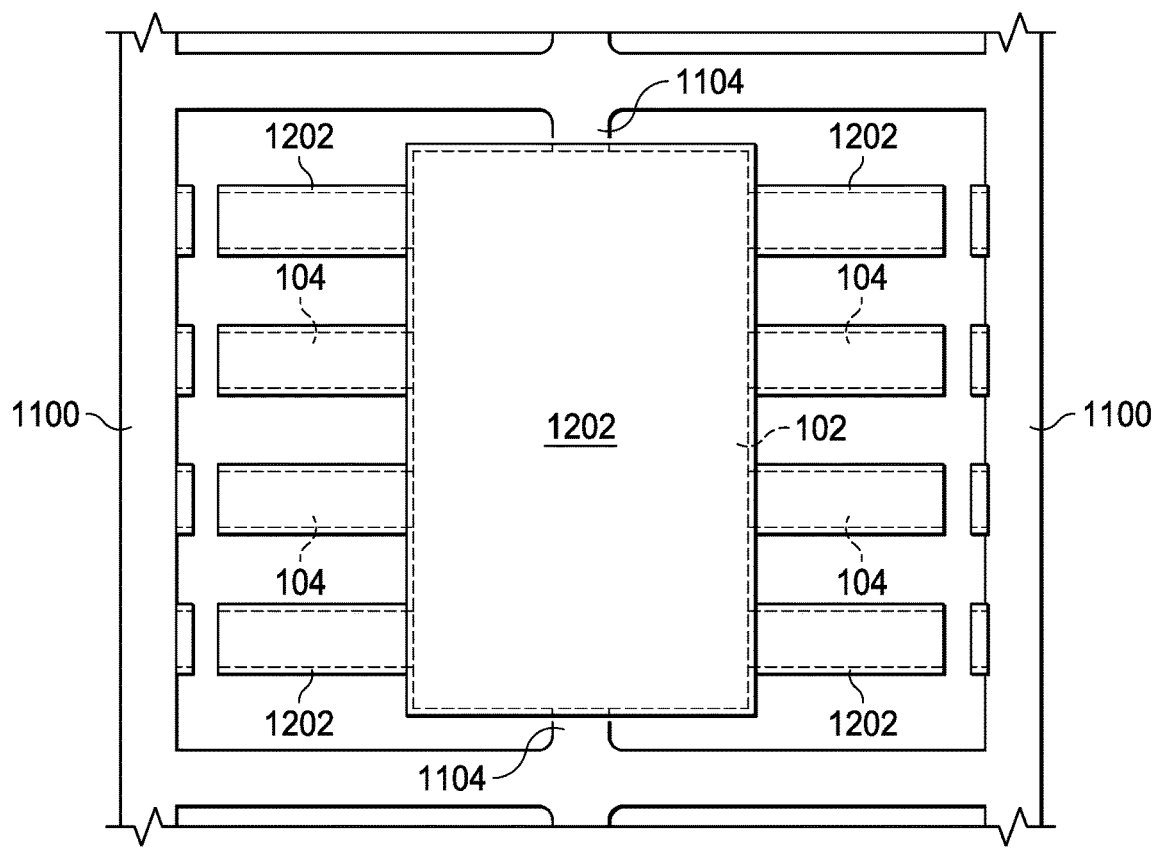
FIG. 11D1
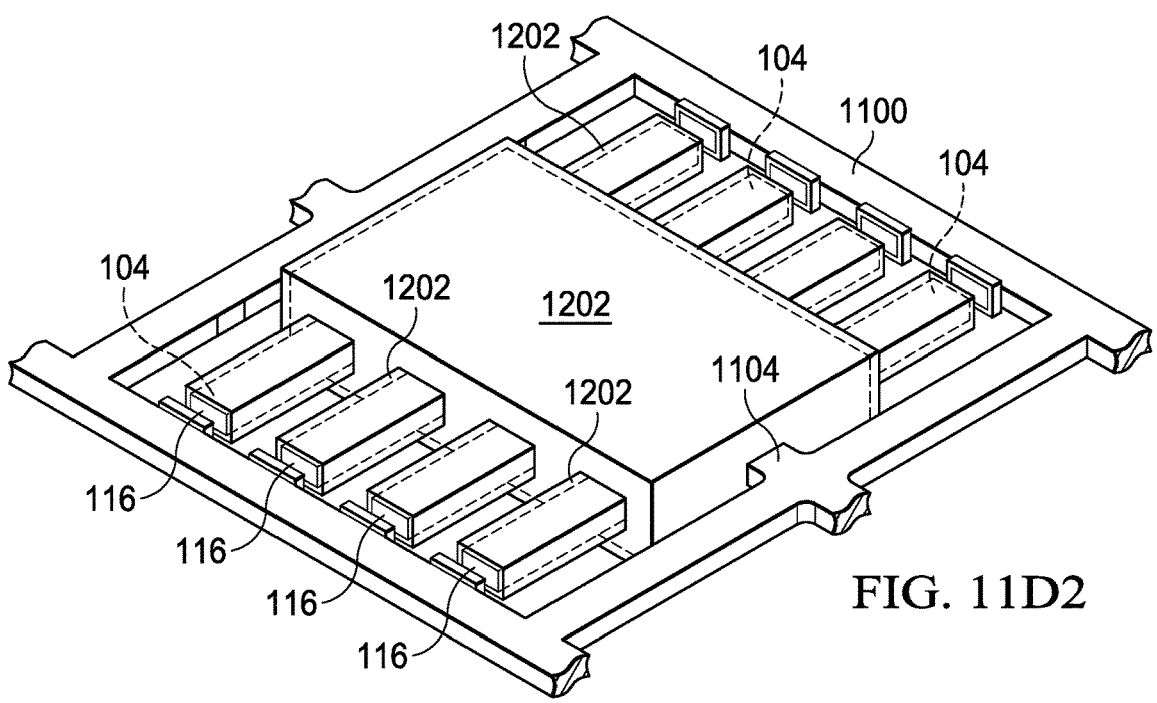
FIG. 11D2

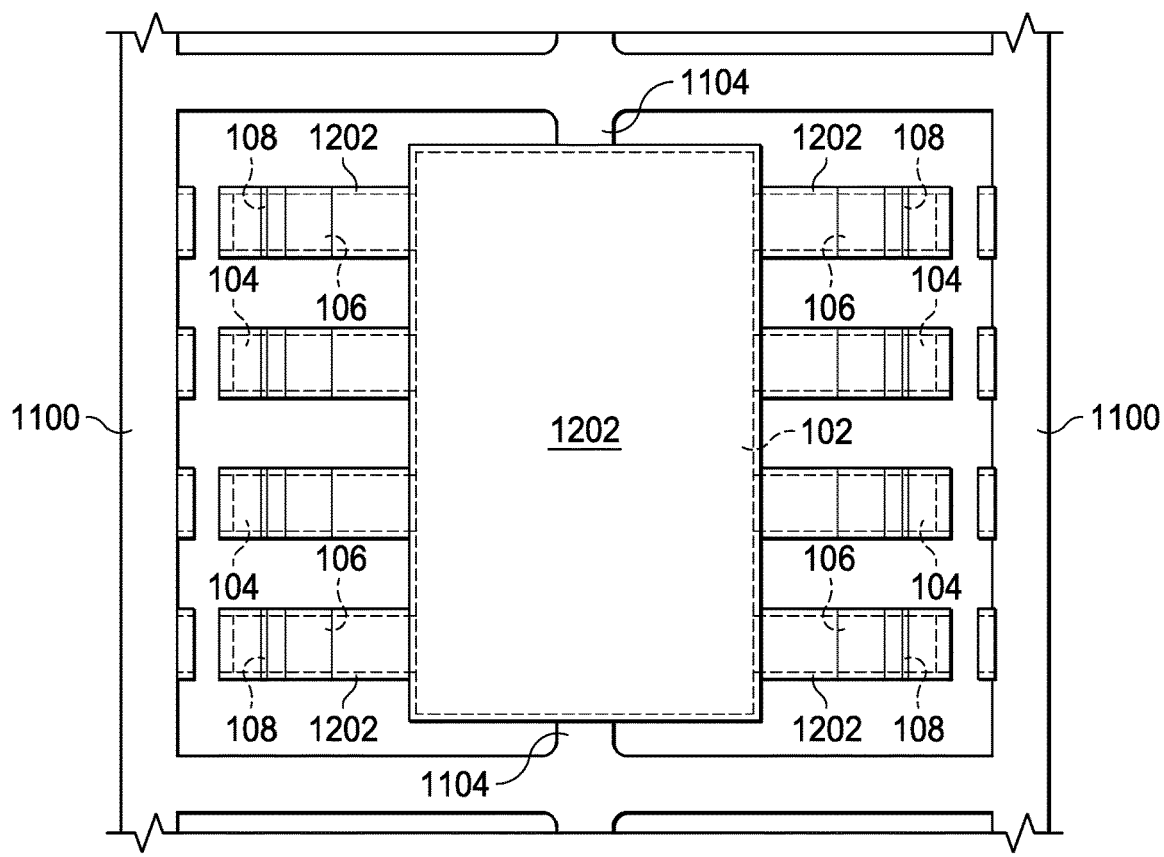
FIG. 11E1
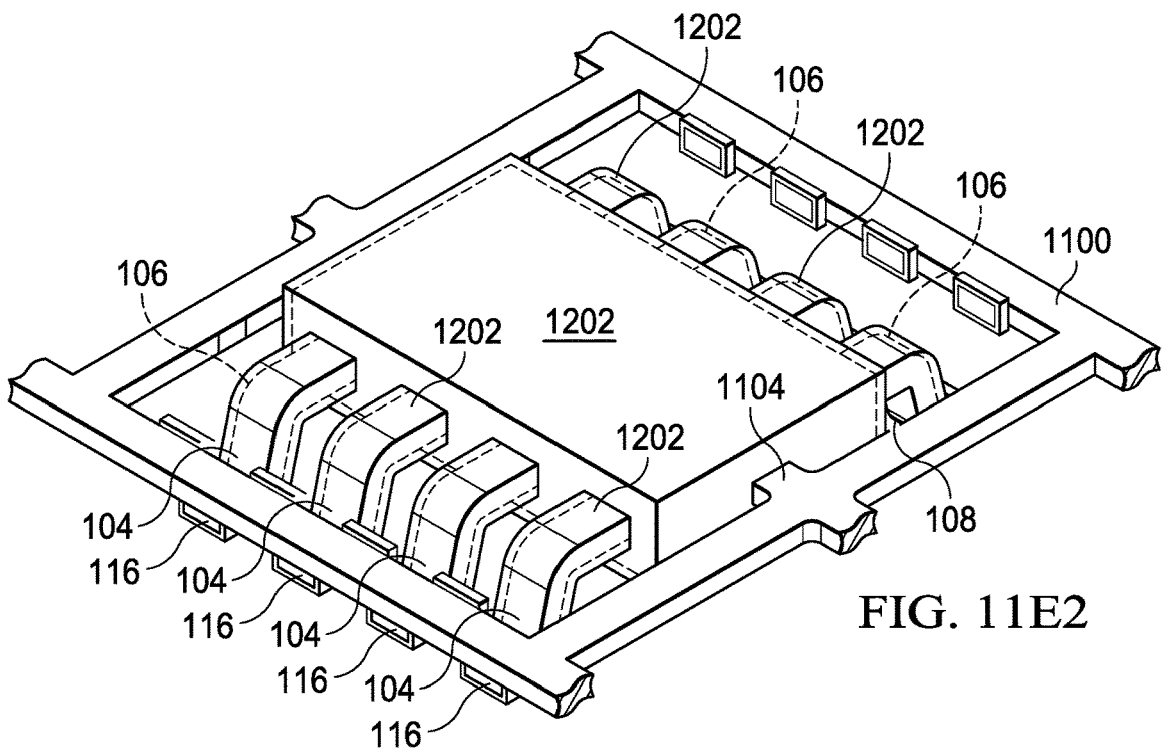
FIG. 11E2

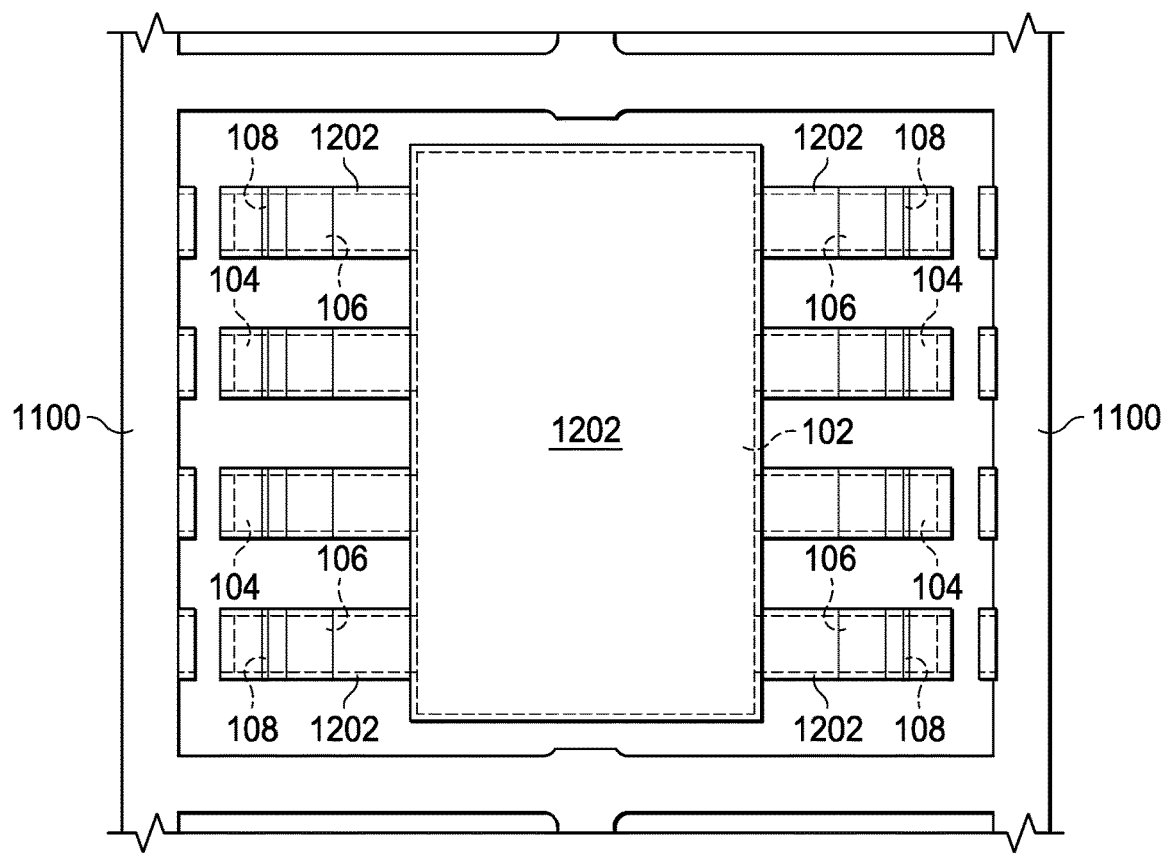
FIG. 11F1
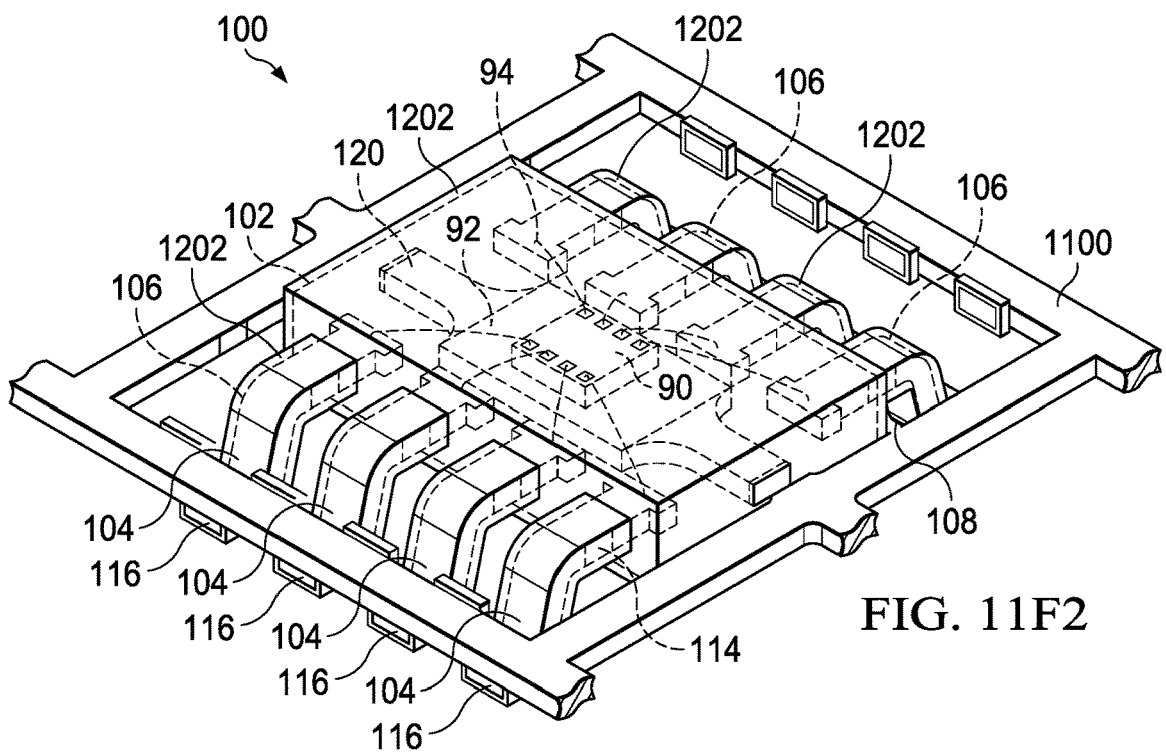
FIG. 11F2

COATED SEMICONDUCTOR DEVICES

This application is a continuation of U.S. application Ser. No. 16/936,290, filed Jul. 22, 2020, the contents of which are herein incorporated by reference in its entirety.

BACKGROUND

Semiconductor chips (also commonly referred to as "dies") are commonly mounted on die pads and are wire-bonded, clipped, or otherwise coupled to conductive terminals. The resulting assembly is subsequently covered in a mold compound housing, such as a plastic housing, to protect the assembly from potentially damaging heat, physical trauma, moisture, and other deleterious factors. The conductive terminals are accessible from an exterior of the housing. The covered assembly is called a semiconductor package or, more simply, a package.

SUMMARY

In examples, a semiconductor device comprises a semiconductor die; an opaque mold compound housing covering the semiconductor die; a conductive terminal extending from the mold compound housing; and an insulative coat covering the mold compound housing and at least a portion of the conductive terminal.

In examples, a method comprises providing a semiconductor device having a plastic housing and a conductive terminal extending from the plastic housing; covering the plastic housing and the conductive terminal with an insulative coat; performing a first curing of the insulative coat; using a solvent to remove the insulative coat from a portion of the conductive terminal; and performing a second curing of the insulative coat covering the plastic housing and the conductive terminal.

BRIEF DESCRIPTION OF THE DRAWINGS

For a detailed description of various examples, reference will now be made to the accompanying drawings in which:

FIGS. 11A1-11F1 depict top-down views of a process flow for manufacturing a coated semiconductor device, in accordance with examples.

FIGS. 11A2-11F2 depict perspective views of a process flow for manufacturing a coated semiconductor device, in accordance with examples.

DETAILED DESCRIPTION

Figure 1A:
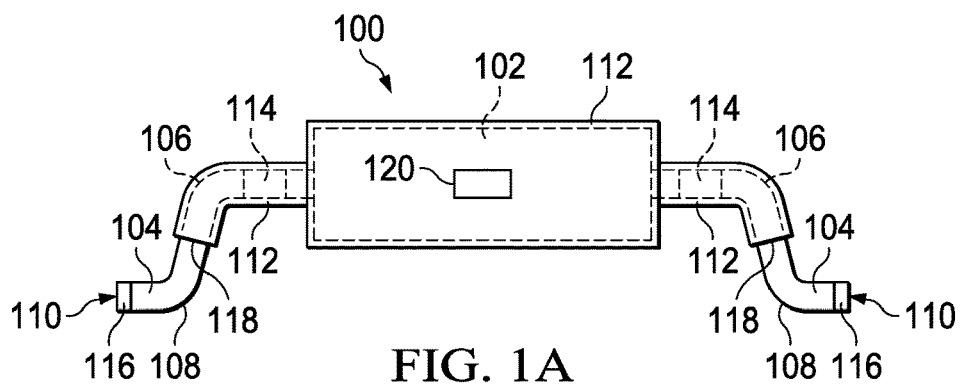
FIG. 1A depicts a frontal view of a dual inline, gullwing-style coated semiconductor device, in accordance with examples.

Semiconductor packages, and in particular, semiconductor packages comprising plastic housings, have a substantial number of weaknesses that predispose the packages to defective operation. The defective operation of semiconductor packages can result in the failure of electronic devices in which the packages are implemented. Such failures can be costly and difficult to repair, and in certain applications (e.g., automotive, medical, high-voltage), they can have catastrophic consequences. Several of these weaknesses are now described.

Plastic semiconductor packages, for example, are porous and thus are susceptible to moisture ingress. Moisture can enter the package through these pores in the plastic housing. In some cases, moisture enters the package through the interfaces at which conductive terminals, such as leads or pins, exit the housing. Moisture can negatively impact the functional integrity of the electronics within the package. In addition, when the package is mounted to a printed circuit board (PCB) using a reflow process, the heat associated with the reflow process causes the moisture inside the package to turn into steam. The steam can crack the package housing and damage the interfaces at which conductive terminals exit the package housing.

In addition to moisture ingress, the corrosion of the conductive terminals of a semiconductor package can also negatively impact functionality. Conductive terminals commonly comprise copper. Because copper is susceptible to corrosion, particularly in certain applications (e.g., automotive applications in which sulfur exposure is possible), the copper is commonly plated with another metal or alloy that is resistant to corrosion. However, if the plating develops cracks, fissures, or is otherwise compromised so that the underlying copper is exposed to the environment, the risk of corrosion rises. The plating may be compromised in a number of ways. For example, some packages include gullwing-style conductive terminals, in which the conductive terminals include multiple bends to form a gullwing shape. These bends are often formed after the copper in the conductive terminal has been plated. The bending process can cause the plating to crack, thereby exposing the underlying copper. In addition, if the plating is performed while the conductive terminals are still attached to a leadframe strip, the subsequent detachment from the leadframe strip (e.g., by cutting dam bars, tie bars, and conductive terminals) causes the copper under the plating to be exposed at the points of detachment. In many instances, a conductive terminal plating may form dendrites, or "whiskers," over time. These whiskers may come into contact with whiskers on other conductive terminals, thus shorting the conductive terminals and negatively impacting the function of the semiconductor package.

Providing adequate isolation between conductive terminals of a semiconductor package can reduce the risk of arcing between the terminals but may introduce disadvantages. For instance, in high voltage applications (e.g., Hall sensor packages), adequate creepage distance (the shortest distance between a pair of conductive terminals on opposing sides of the semiconductor package measured along the surface of the semiconductor package) is useful in preventing arcing between conductive terminals. Although increasing the creepage distance can prevent arcing, the increased creepage distance also results in a larger package size, which is undesirable. Similarly, different types of mold compounds used to form the semiconductor package housing have different comparative tracking indices (CTI). The CTI is a measure of the electrical breakdown properties of the mold compound used to form a semiconductor package housing. Higher CTIs provide superior isolation and mitigate the risk of arcing, but often at the expense of other desired properties of the mold compound.

This disclosure describes a coated semiconductor device that mitigates the susceptibilities identified above. In examples, the coated semiconductor device comprises a semiconductor die, a mold compound housing covering the semiconductor die, and a conductive terminal extending from the mold compound housing. An insulative coat, for example, a polymer, solder resist, or ceramic coat, covers the mold compound housing and at least a portion of the conductive terminal. The insulative coat seals pores of the mold compound housing, thus blocking moisture ingress through the pores. Because the insulative coat covers the mold compound housing and extends from the housing to cover at least a portion of the conductive terminal, the insulative coat also seals the interface at which the conductive terminal exits the mold compound housing, thus preventing moisture ingress through the interface. Cracks in the conductive terminal plating, as well as copper exposure at the sites of the dam bar, tie bar, and conductive terminal (e.g., lead) cuts, are sealed by the insulative coat, thus precluding corrosion of the copper underlying the conductive terminal plating. The insulative coat also prevents whisker formation, thus precluding whiskers on adjacent conductive terminals from coming into contact with each other and creating an electrical short. Furthermore, because in some examples the insulative coat extends to cover portions of multiple conductive terminals (e.g., conductive terminals on opposing sides of the semiconductor package), the creepage distance between the plating-exposed areas of the conductive terminals is increased, thereby mitigating the risk of arcing between the conductive terminals without increasing package size. Similarly, an insulative coat with a high CTI may be used without removing the underlying mold compound, thus mitigating arcing risk while still preserving the benefits provided by the properties of the chosen mold compound. Example coated semiconductor devices are now described with respect to the drawings.

FIG. 1A depicts a frontal view of a dual inline, gullwing-style coated semiconductor device 100 (e.g., semiconductor package), in accordance with examples. The semiconductor device 100 includes a mold compound housing 102 that covers a semiconductor die (not expressly shown in FIG. 1A; shown in FIG. 1C). The mold compound housing 102 may be composed of any suitable material, such as plastic or ceramic. In some examples, the mold compound housing 102 is opaque, and in some examples, the mold compound housing 102 is translucent. The semiconductor device 100 comprises conductive terminals 104 extending from the mold compound housing 102. The conductive terminals 104 may be of any suitable shape and size. In examples, the conductive terminals 104 have a gullwing shape, with bends 106 and 108 in each conductive terminal 104 forming the gullwing shape, and ends 110. In examples, the conductive terminals 104 comprise a metal such as copper and are plated (e.g., with tin, nickel palladium gold, etc.), and in other examples, the conductive terminals 104 are not plated. The remainder of this description assumes that the conductive terminals 104 are plated. Due to the dam bar cutting process, the copper underlying the plating may be exposed, as numerals 114 indicate. Due to the lead cutting process, the copper underlying the plating may be exposed, as numerals 116 indicate. Due to the tie bar cutting process, tabs 120 (also referred to herein as metal members), which couple to, e.g., die pads within the mold compound housing 102, are exposed to an exterior of the mold compound housing 102. The semiconductor device 100 further comprises a coat 112 that covers (e.g., abuts) the mold compound housing 102 (including the tabs 120) and a portion of each of the conductive terminals 104. For example, the coat 112 covers a length of a conductive terminal 104 extending from a surface of the mold compound housing 102 to a point 118. In examples, the coat 112 covers the exposed areas 114. In examples, the coat 112 covers bends 106. In examples, the coat 112 covers bends 108. In some examples, the coat 112 covers the bends 106 and not bends 108 of some conductive terminals 104, while the coat 112 covers the bends 106 and the bends 108 of other conductive terminals 104. In some examples, the coat 112 covers the exposed areas 114 but not the bends 106, 108. In some examples, the coat 112 covers the mold compound housing 102 but not the conductive terminals 104. In examples, the coat 112 covers the entirety of all surfaces of the mold compound housing 102, and in other examples, the coat 112 covers less than the entirety of all surfaces of the mold compound housing 102. In examples, the coat 112 covers fewer than all surfaces of the mold compound housing 102. In examples, the coat 112 covers all surfaces of the mold compound housing 102, but each surface covered is only partially covered. Any such variations are contemplated and included in the scope of this disclosure.

In examples, the coat 112 is composed of an insulative material, such as a polymer (e.g., polyimide, resin, epoxy, urethane, silicone), a solder resist, and a ceramic. To qualify as insulative, a coat should have a volume resistivity of $1 \times 10^{10}$ Ohm-cm or higher. In examples, the coat 112 is composed of any suitable metal or alloy. In examples where the coat 112 comprises a metal, the coat 112 may not contact the conductive terminals 104, to avoid shorting the conductive terminals 104 together. The material for the coat 112 may be selected depending on various factors. One such factor is the degree of hydrophobia exhibited by the material. In examples, the degree of hydrophobia is measured in water contact angles and ranges from 95 degrees to 130 degrees; in some examples, the water contact angle is at least 160 degrees; and in some examples, the water contact angle is at least 90 degrees. The hydrophobia level selected for the coat material is not a mere design choice; rather, the specific degree of hydrophobia selected provides certain advantages and disadvantages, such as greater moisture resistance but increased risk of brittleness and delamination for a higher degree of hydrophobia and lesser moisture resistance but lowered risk of brittleness and delamination for a lower degree of hydrophobia. Another factor is the CTI of the coat material. In examples, the CTI of the coat material is CTI category one with a minimum performance level of two. The CTI selected for the coat material is not a mere design choice; rather, the specific CTI selected provides certain advantages and disadvantages, such as greater proximity between electrical components for performance level one and lesser proximity between electrical components for performance level two and higher (to compensate for lower CTI). Yet another factor is whether a high-K dielectric or a low-K dielectric is desired, with a dielectric constant range from two to five being included in the scope of this disclosure. The dielectric selected is not a mere design choice; rather, the specific dielectric selected provides certain advantages and disadvantages, such as the ability to withstand high voltages but some loss of properties such as elongation, adhesion, etc. for a high-K dielectric and the retention of properties such as elongation and adhesion but a lesser ability to withstand high voltages for a low-K dielectric.

Still another factor is the desired flexibility of the coat material used, with a modulus range of 1 Giga Pascal (GPa) to 3 GPa being included in the scope of this disclosure. The degree of flexibility selected is not a mere design choice; rather, the specific degree of flexibility selected provides certain advantages and disadvantages, such as low modulus values resulting in scratches, peeling, etc., and high modulus values causing fissures in the material during temperature cycling. Still another factor is the desired viscosity of the coat material used during manufacture, with a range from 20 Poise to 150 Poise being included in the scope of this disclosure. The value selected is not a mere design choice; rather, the specific value selected provides certain advantages and disadvantages, with a higher value resulting in non-uniform coverage due to uneven flow, and a lower value resulting in voids and an undesirably thin coat. Still another factor is the desired molecular weight of the coat material used, with a range from 10,000 g/mol to 50,000 g/mol being included in the scope of this disclosure. The value selected is not a mere design choice; rather, the specific value selected provides certain advantages and disadvantages, with shorter chains resulting in a reduced modulus and increased moisture absorption and longer chains resulting in undesirably hard material that can separate from the mold compound underneath the coat. Yet another factor is the desired tensile strength of the coat material used, with a range from 100 to 400 Mega Pascals (MPa) being included in the scope of this disclosure. The value selected is not a mere design choice; rather, the specific value selected provides certain advantages and disadvantages, with a high value resulting in difficulty of manufacture with thin coats and a lower value resulting in lowered stretching ability and fissures during temperature cycling.

Another factor is the desired hermeticity (e.g., gas permeability) of the coat material used. In some examples, the hermeticity should pass the MIL-STD-883-TM1014 test. The value selected is not a mere design choice; rather, the specific value selected provides certain advantages and disadvantages, with a higher hermeticity resulting in increased costs and greater blocking of gas and a lower hermeticity resulting in decreased costs but lesser blocking of gas.

In some examples, the coat 112 has a thickness ranging from 100 nanometers to 10 microns, inclusive. In some examples, the coat 112 has a uniform thickness, and in some examples, the coat 112 has a varying thickness.

Figure 1B:
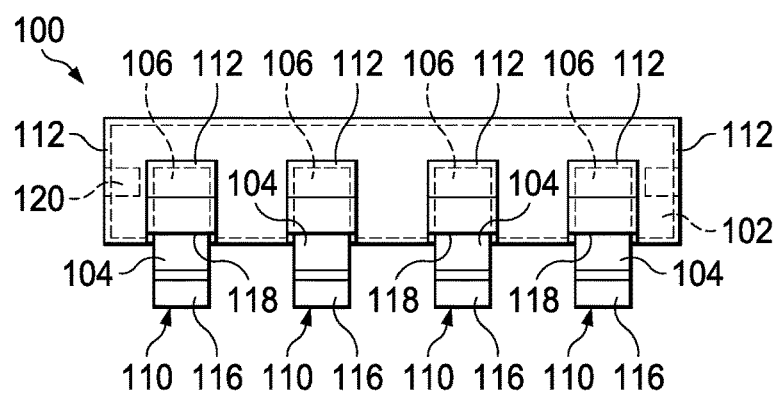
FIG. 1B depicts a side view of a dual inline, gullwing-style coated semiconductor device, in accordance with examples.
Figure 1C:
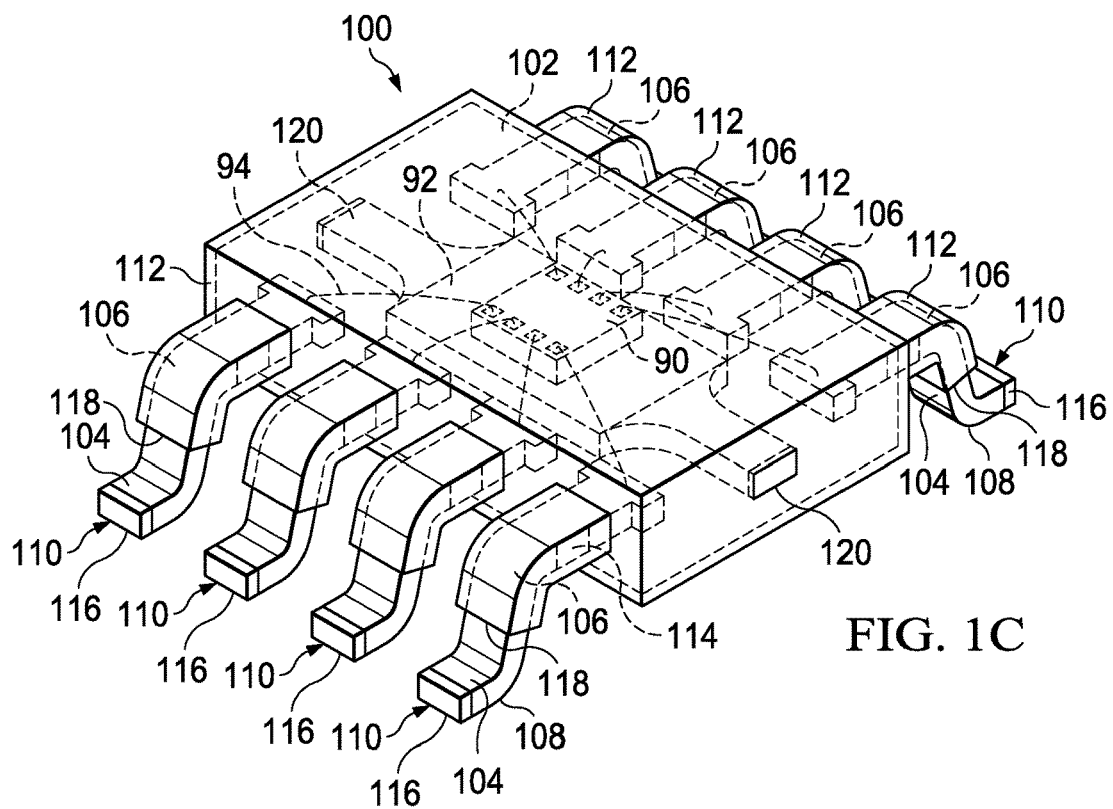
FIG. 1C depicts a perspective view of a dual inline, gullwing-style coated semiconductor device, in accordance with examples.

An insulative coat 112 provides numerous advantages. By covering the bends 106, 108, cracks in the plating of the conductive terminals 104 are either prevented from being formed or are hermetically sealed such that the underlying metal (e.g. copper) of the conductive terminals 104 is not exposed and thus is not at risk of corrosion. Similarly, by covering the bends 106, 108, the insulative coat 112 prevents whisker growth at the bends 106, 108, thereby preventing whiskers from shorting together different conductive terminals 104. In addition, moisture ingress into the semiconductor device 100 is mitigated, because the insulative coat 112 hermetically seals the porous surface of the mold compound housing 102 and/or hermetically seals the interfaces between the mold compound housing 102 and the conductive terminals 104. (The interfaces are the portions of mold compound housing 102 that abut the conductive terminals 104 as the conductive terminals 104 exit the mold compound housing 102. These interfaces contain small gaps between the mold compound housing 102 and the conductive terminals 104 through which moisture may enter, but the insulative coat 112 hermetically seals these interfaces to mitigate such moisture ingress.) Because moisture ingress is mitigated, the problems that result from such moisture ingress are also mitigated. When the insulative coat 112 covers portions of the conductive terminals 104, the creepage distance between the exposed portions of opposing conductive terminals is increased, thus reducing the likelihood of arcing in high-voltage applications without increasing the overall size of the semiconductor device 100. Furthermore, the material used to form the insulative coat 112 may be selected for its beneficial CTI properties, but because the insulative coat 112 covers the mold compound housing 102 instead of replacing the mold compound housing 102, beneficial properties of the mold compound housing 102 are retained. These and other benefits and advantages may be realized by using an insulative coat 112 as described herein. A metallic coat 112 may also provide some of these benefits as well as other benefits. For example, electromagnetic fields (EMF) generated by circuitry within the semiconductor device 100 (and, more specifically, in the mold compound housing 102) may interfere with other electronic devices in the vicinity of the semiconductor device 100. However, if a metallic coat 112 is used, or if a metallic coat covers an insulative coat 112, such EMF may be attenuated and prevented from negatively impacting the function of other electronic devices in the vicinity. FIG. 1B depicts a side view of the coated semiconductor device 100, and FIG. 1C depicts a perspective view of the coated semiconductor device 100. FIG. 1C additionally depicts example contents of the semiconductor device 100, such as a semiconductor die 90 mounted on a die pad 92 and coupled to the conductive terminals 104 via bond wires 94.

Figure 2A:
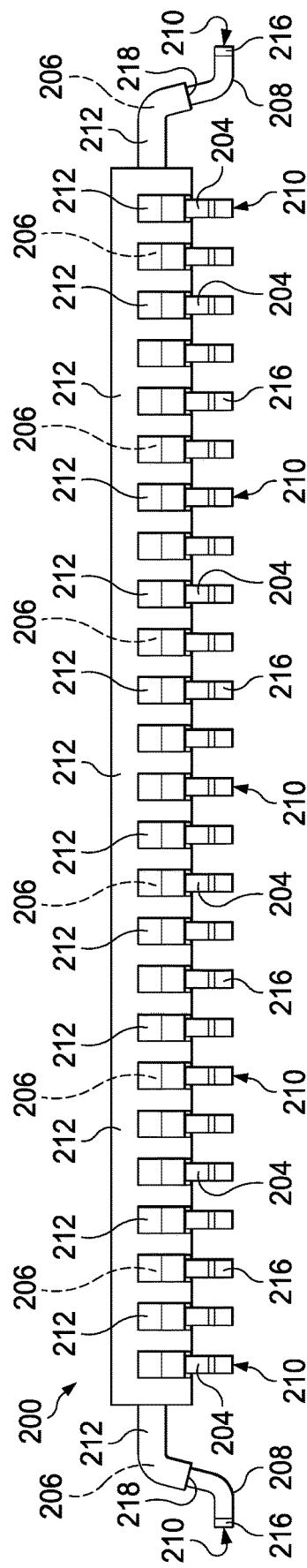
FIG. 2A depicts a frontal view of a quad flat, gullwing-style coated semiconductor device, in accordance with examples.
Figure 2B:
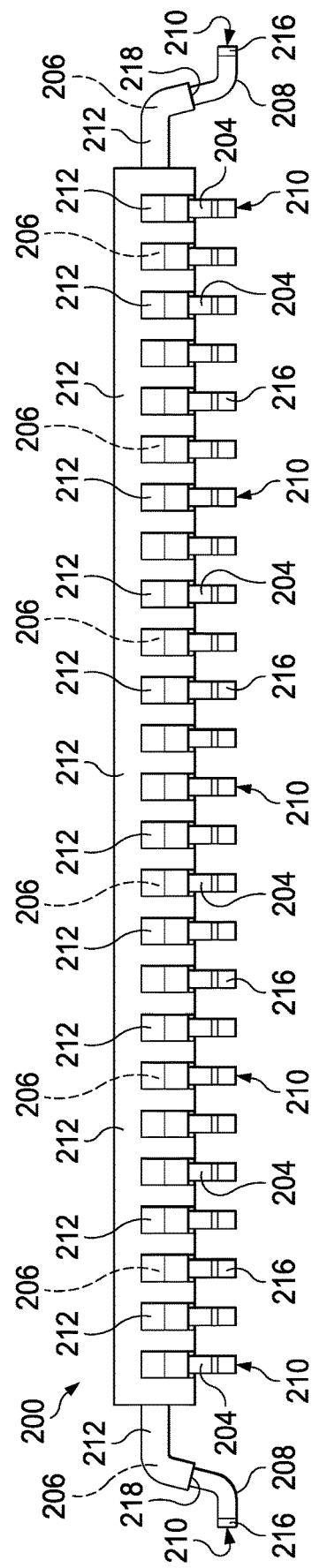
FIG. 2B depicts a side view of a quad flat, gullwing-style coated semiconductor device, in accordance with examples.
Figure 2C:
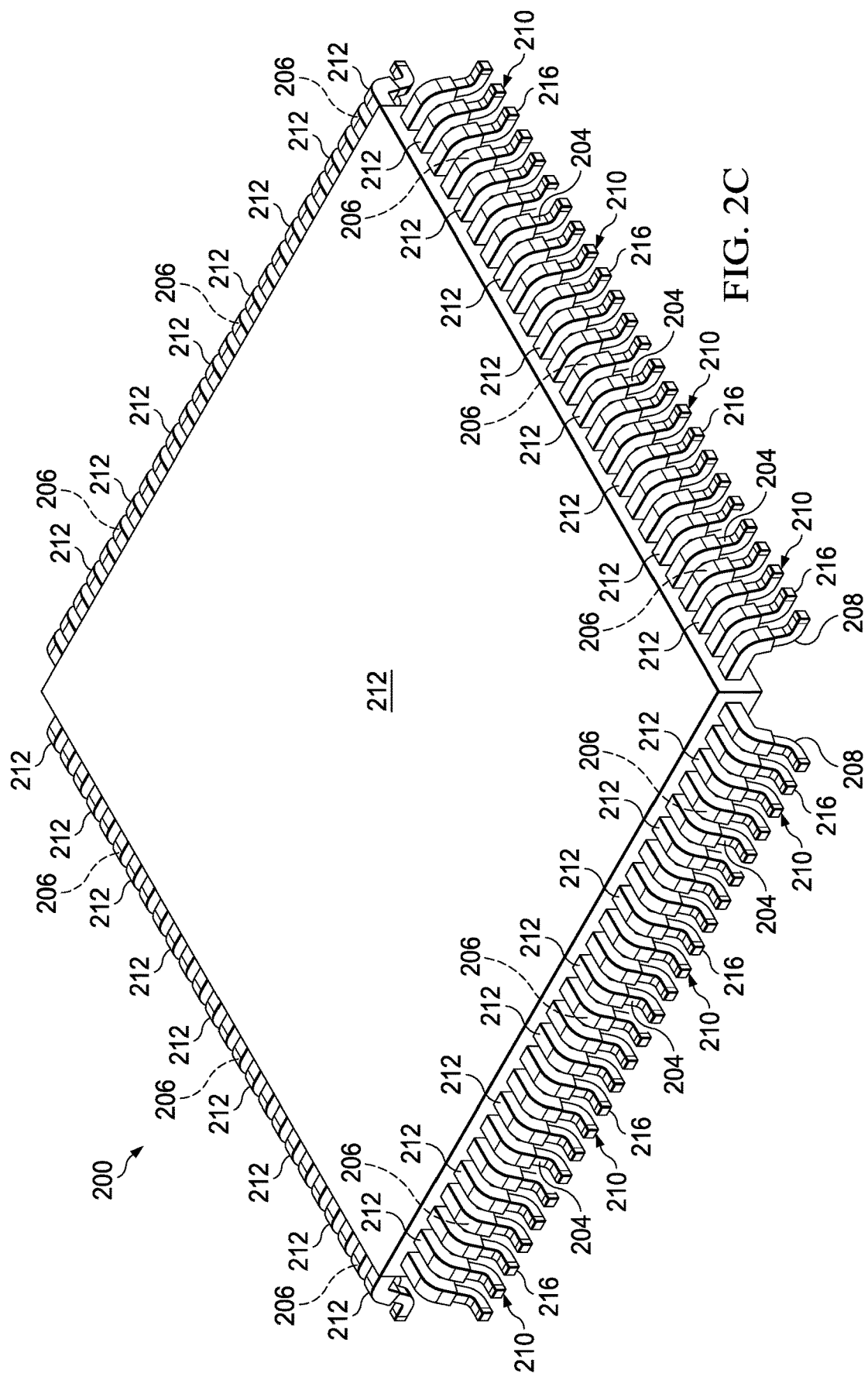
FIG. 2C depicts a perspective view of a quad flat, gullwing-style coated semiconductor device, in accordance with examples.

FIG. 2A depicts a frontal view of a quad flat, gullwing-style coated semiconductor device 200 (e.g., semiconductor package), in accordance with examples. Unless otherwise noted, in FIGS. 2A-2C, like numerals refer to like components with respect to FIGS. 1A-1C (e.g., numerals 104 and 204 both refer to conductive terminals, and so on). The semiconductor device 200 includes a mold compound housing (not expressly shown) and multiple conductive terminals 204 extending from the mold compound housing. The mold compound housing covers a semiconductor die (not expressly shown). Each conductive terminal 204 includes bends 206, 208, an end 210, an exposed area at which dam bars have been cut (not expressly shown), and an exposed area 216 at which conductive terminals (e.g., leads) have been cut. A coat 212 (e.g., insulative, metallic) covers the mold compound housing and portions of the conductive terminals 204 (e.g., lengths of conductive terminals 204 extending from the mold compound housing to points 218). The description provided above for the coat 112 applies to the coat 212 and thus is not repeated here. FIGS. 2B and 2C provide side and perspective views, respectively, of the coated semiconductor device 200.

Figure 3A:
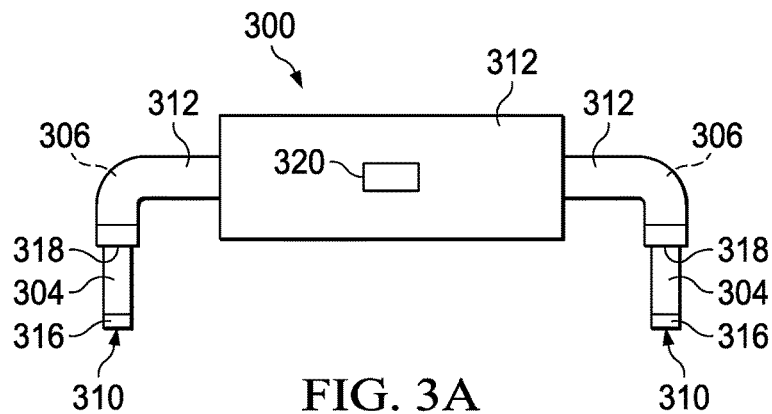
FIG. 3A depicts a frontal view of another dual inline, gullwing-style coated semiconductor device, in accordance with examples.
Figure 3B:
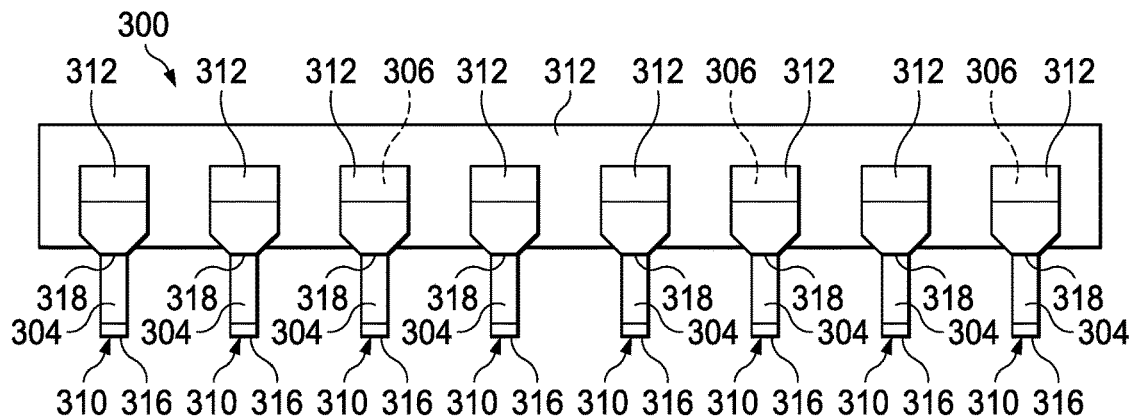
FIG. 3B depicts a side view of another dual inline, gullwing-style coated semiconductor device, in accordance with examples.
Figure 3C:
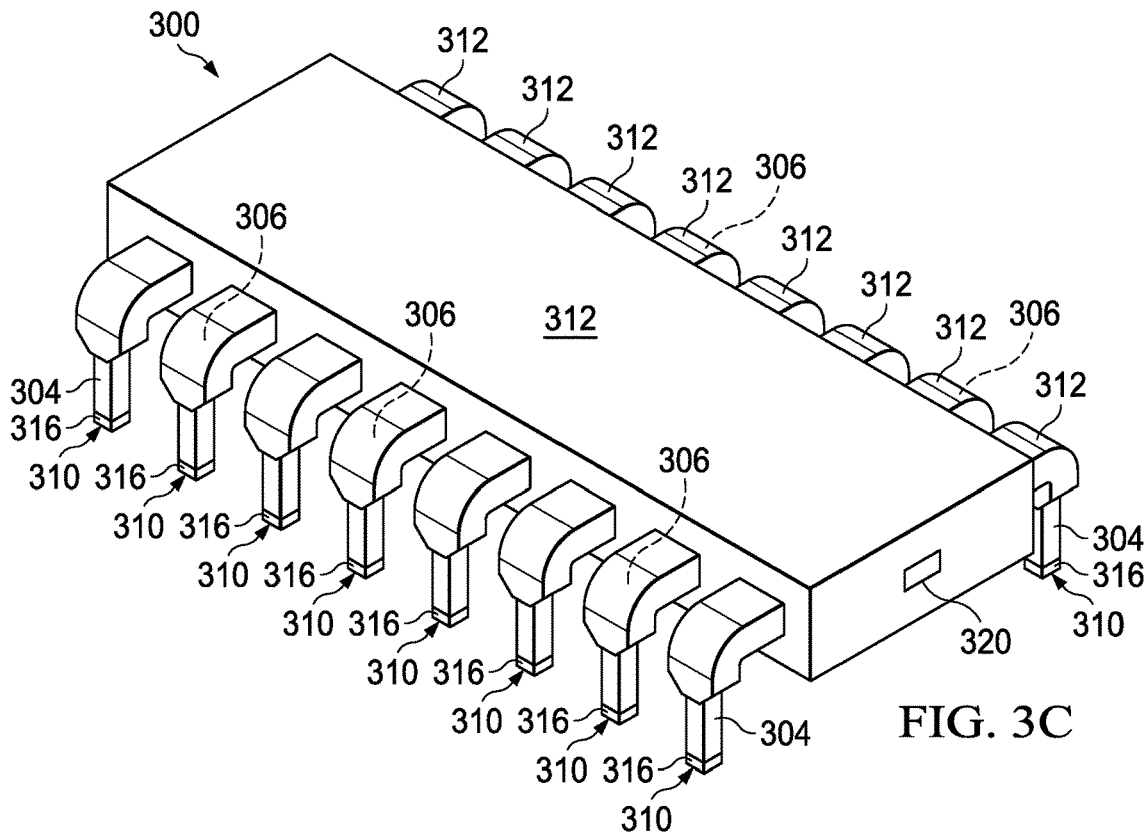
FIG. 3C depicts a perspective view of another dual inline, gullwing-style coated semiconductor device, in accordance with examples.

FIG. 3A depicts a frontal view of another dual inline, gullwing-style coated semiconductor device 300 (e.g., semiconductor package), in accordance with examples. Unless otherwise noted, in FIGS. 3A-3C, like numerals refer to like components with respect to FIGS. 1A-1C and 2A-2C (e.g., numerals 104, 204, and 304 refer to conductive terminals, and so on). The semiconductor device 300 includes a mold compound housing (not expressly shown) covering a semiconductor die (not expressly shown) and multiple conductive terminals 304 extending from the mold compound housing. Each conductive terminal 304 includes a bend 306, an end 310, an exposed area (not expressly shown) at which dam bars have been cut, and an exposed area 316 at which conductive terminals (e.g., leads) have been cut. A coat 312 (e.g., insulative, metallic) covers the mold compound housing and portions of the conductive terminals 304 (e.g., lengths of conductive terminals 304 extending from the mold compound housing to points 318). The description provided above for the coat 112 applies to the coat 312 and thus is not repeated here. FIGS. 3B and 3C provide side and perspective views, respectively, of the coated semiconductor device 300.

Figure 4A:
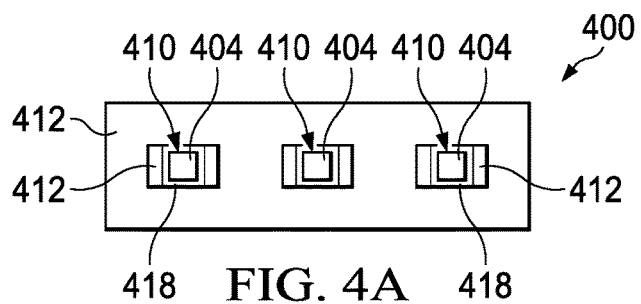
FIG. 4A depicts a frontal view of a transistor outline coated semiconductor device, in accordance with examples.
Figure 4B:
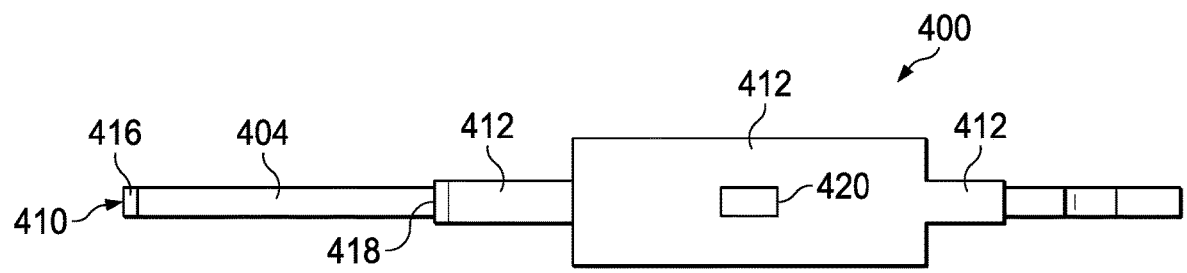
FIG. 4B depicts a side view of a transistor outline coated semiconductor device, in accordance with examples.
Figure 4C:
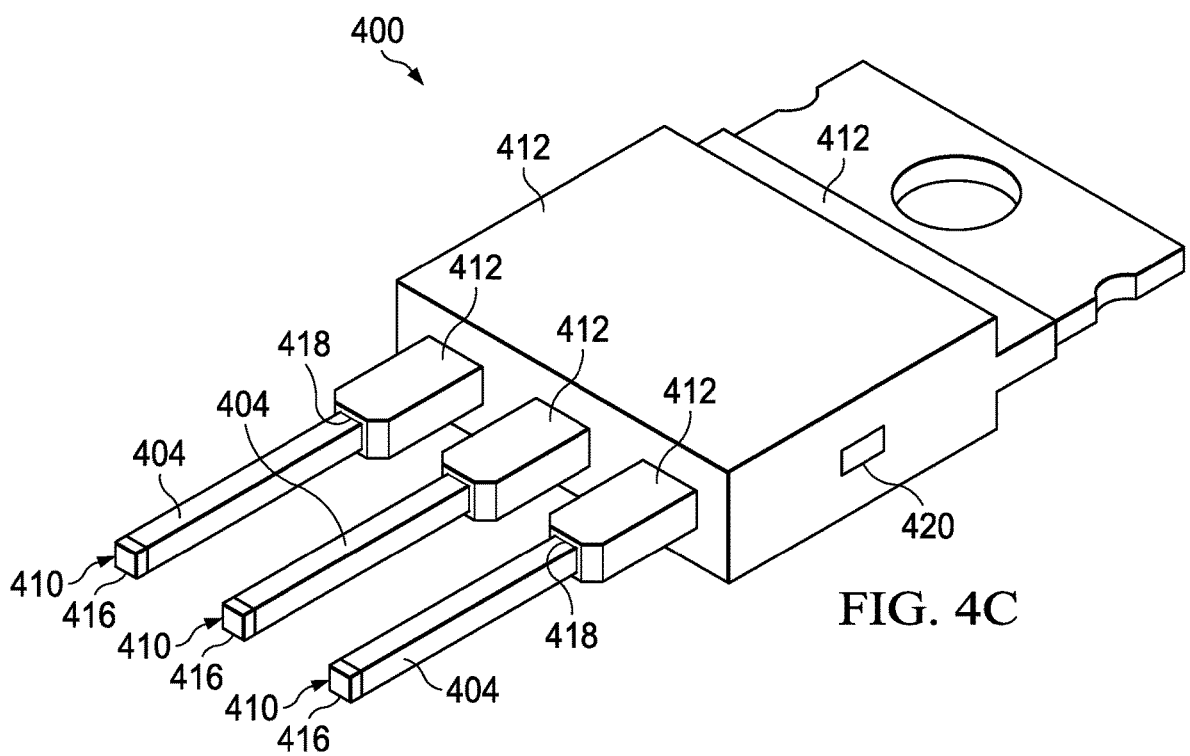
FIG. 4C depicts a perspective view of a transistor outline coated semiconductor device, in accordance with examples.

FIG. 4A depicts a frontal view of a transistor outline coated semiconductor device 400 (e.g., semiconductor package), in accordance with examples. The semiconductor device 400 includes a mold compound housing (not expressly shown) covering a semiconductor die (not expressly shown) and multiple conductive terminals 404 extending from the mold compound housing. Each conductive terminal 404 includes an end 410, an exposed area (not expressly shown) at which dam bars have been cut, and an exposed area 416 at which conductive terminals (e.g., leads) have been cut. A coat 412 (e.g., insulative, metallic) covers the mold compound housing and portions of the conductive terminals 404 (e.g., lengths of conductive terminals 404 extending from the mold compound housing to points 418). The description provided above for the coat 112 applies to the coat 412 and thus is not repeated here. FIGS. 4B and 4C provide side and perspective views, respectively, of the coated semiconductor device 400.

Figure 5A:
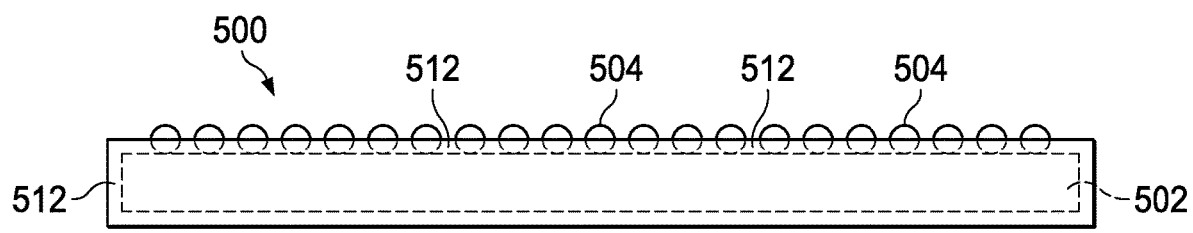
FIG. 5A depicts a side view of a ball grid array (BGA) coated semiconductor device, in accordance with examples.
Figure 5B:
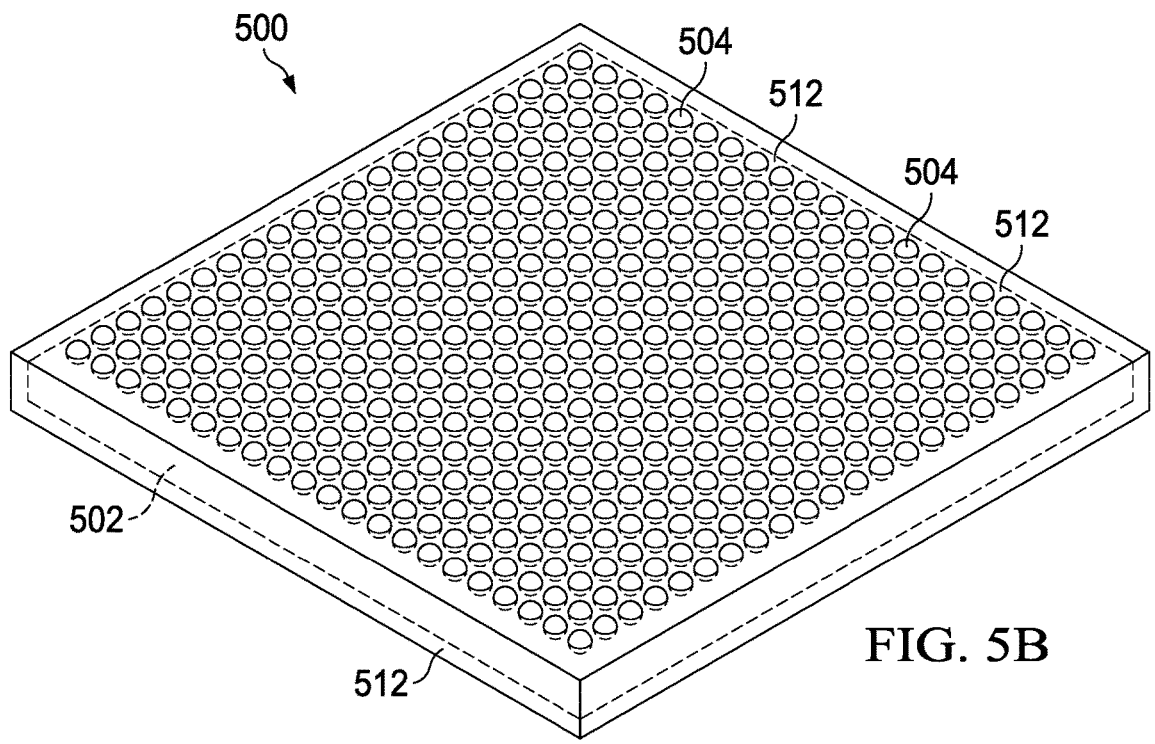
FIG. 5B depicts a perspective view of a BGA coated semiconductor device, in accordance with examples.

FIG. 5A depicts a side view of a ball grid array (BGA) coated semiconductor device 500 (e.g., semiconductor package), in accordance with examples. The semiconductor device 500 includes a mold compound housing 502 that covers a semiconductor die and a redistribution layer (RDL) (neither of which is expressly shown). Multiple spherical conductive terminals 504 extend from the mold compound housing 502. A coat 512 covers the mold compound housing 502. In some examples, the coat 512 (e.g., an insulative coat) covers all surfaces of the mold compound housing 502, including surfaces positioned in between the conductive terminals 504. In some examples, the coat 512 (e.g., a metallic coat) covers surfaces of the mold compound housing 502 in a manner such that the coat 512 does not short the conductive terminals 504 to each other. The description of the coat 112 provided above also applies to the coat 512, and thus the description is not repeated here. FIG. 5B provides a perspective view of the coated semiconductor device 500.

Figure 6A:
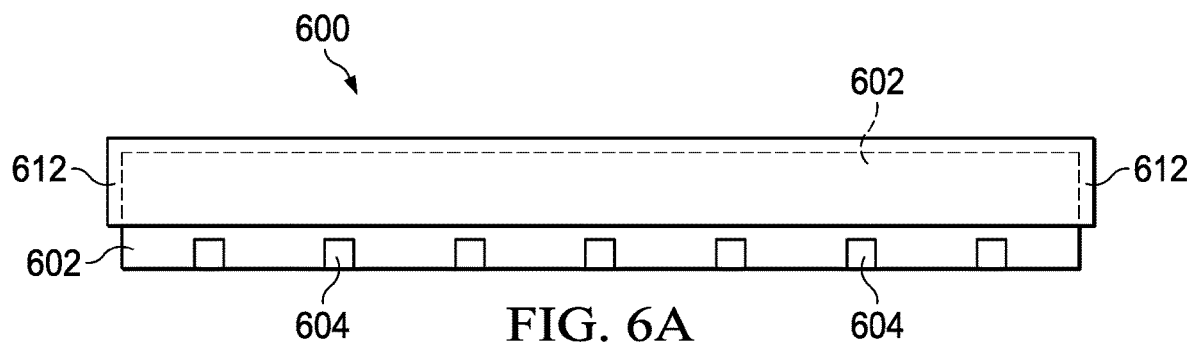
FIG. 6A depicts a side view of a quad flat no lead (QFN) coated semiconductor device, in accordance with examples.
Figure 6B:
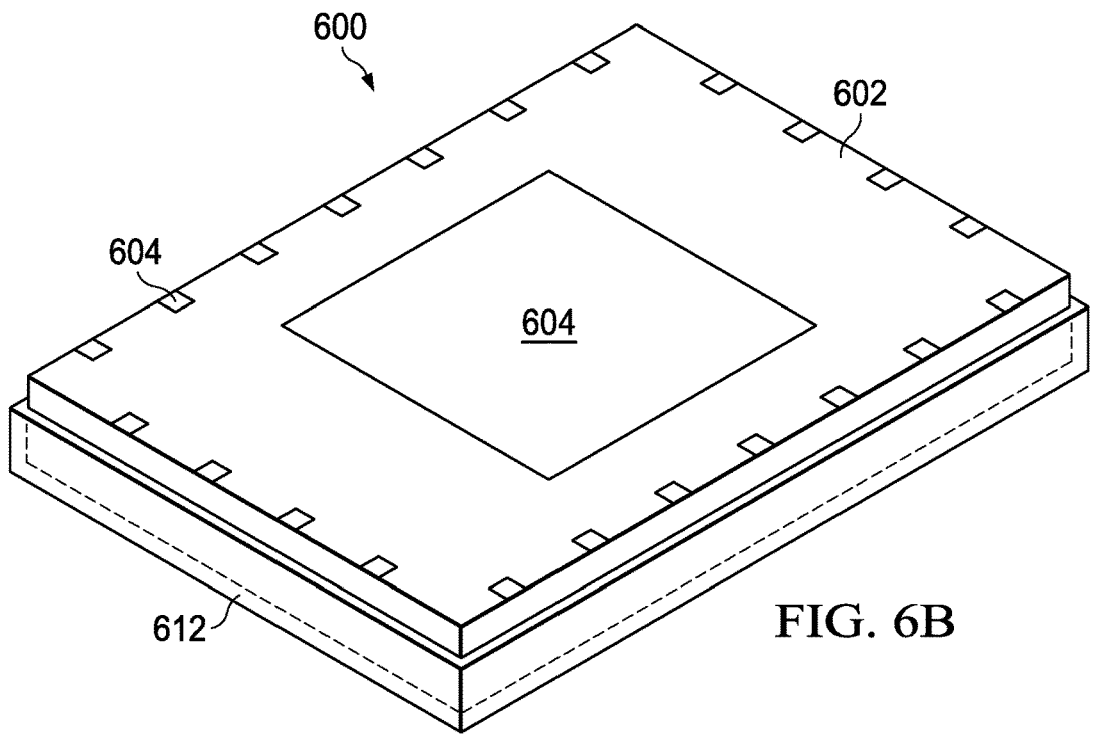
FIG. 6B depicts a perspective view of a QFN coated semiconductor device, in accordance with examples.
Figure 6C:
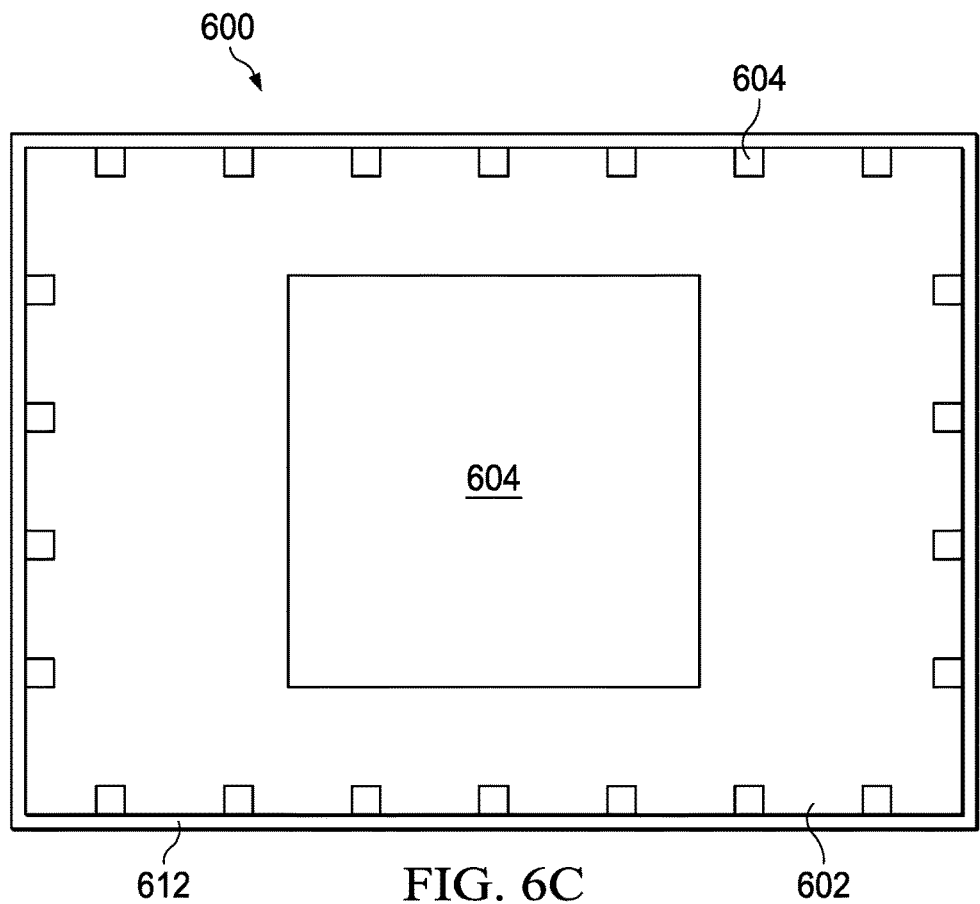
FIG. 6C depicts a bottom-up view of a QFN coated semiconductor device, in accordance with examples.

FIG. 6A depicts a side view of a quad flat no lead (QFN) coated semiconductor device 600, in accordance with examples. The semiconductor device 600 comprises a mold compound housing 602 covering a semiconductor die (not expressly shown). The semiconductor device 600 includes a plurality of conductive terminals 604. A coat 612 (e.g., insulative, metallic) covers the mold compound housing 602 as shown. The description of the coat 112 provided above also applies to the coat 612 and thus is not repeated here. FIG. 6B is a perspective view of the coated semiconductor device 600 of FIG. 6A. FIG. 6C provides a bottom-up view of the coated semiconductor device 600 of FIG. 6A.

Figure 7:
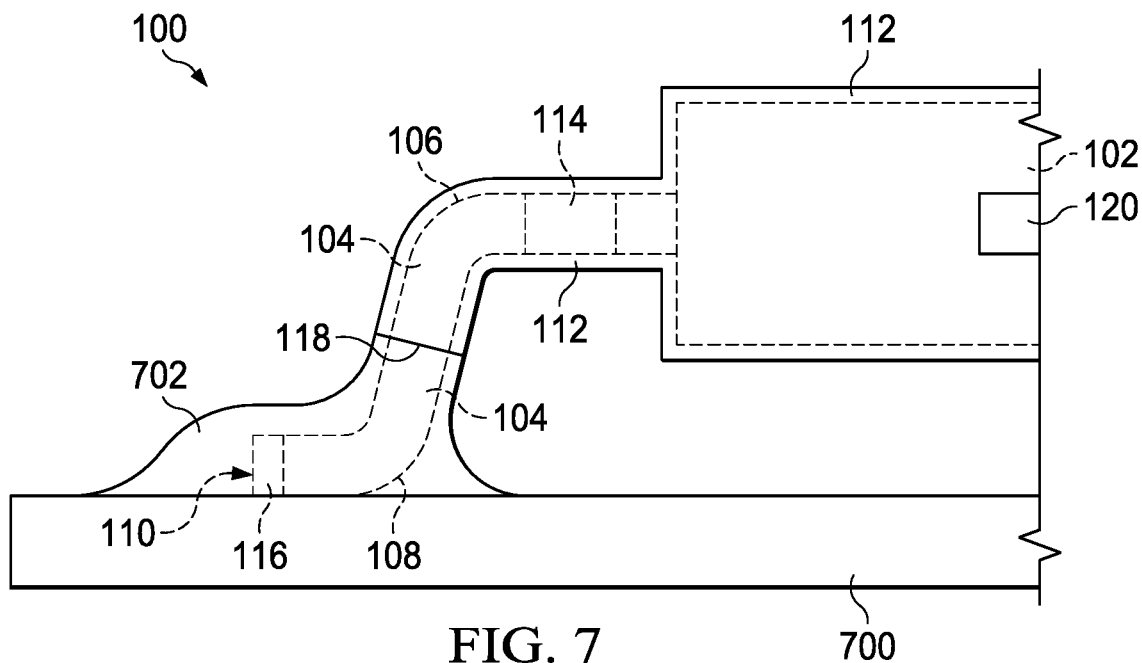
FIGS. 7-10 depict side views of various coated semiconductor devices, including detailed views of gullwing-style conductive terminals extending from mold compound housings, in accordance with examples.

FIGS. 7-10 depict side views of various coated semiconductor devices, including detailed views of gullwing-style conductive terminals extending from mold compound housings, in accordance with examples. In FIG. 7, the coated semiconductor device 100 comprises the mold compound housing 102 and a conductive terminal 104 extending from the mold compound housing 102. The coat 112 (e.g., an insulative coat) covers the mold compound housing 102 and a portion of the conductive terminal 104. The mold compound housing 102 and the conductive terminal 104 are depicted in dashed lines because they are covered by the coat 112. The coat 112 covers the conductive terminal 104 from the mold compound housing 102 to the point 118. Thus, in examples, the coat 112 covers the interface at which the conductive terminal 104 exits the mold compound housing 102, the exposed area 114, and the bend 106. In examples, the coat 112 covers the bend 108 and the exposed area 116 at the end 110. In examples, the coat 112 does not cover the conductive terminal 104 beyond the point 118. Thus, in such examples, the coat 112 does not cover the bend 108 or the exposed area 116 at the end 110. In examples, a metal joint 702 (e.g., a solder joint) mechanically and electrically couples the conductive terminal 104 (e.g., the area of the conductive terminal 104 between the point 118 and the end 110) to a printed circuit board (PCB) 700. In examples, the metal joint 702 covers all areas of the conductive terminal 104 not covered by the coat 112. In examples, the metal joint 702 covers less than all areas of the conductive terminal 104 not covered by the coat 112. For example, the metal joint 702 may cover the conductive terminal 104 from the end 110 to a point closer to the end 110 than the point 118. The coat 112 provides the benefits described above, and in addition, the metal joint 702 precludes whisker formation at the bend 108 and prevents oxidation of the copper exposed at exposed area 116 and copper exposed at any cracks that may form, e.g., at the bend 108.

Figure 8:
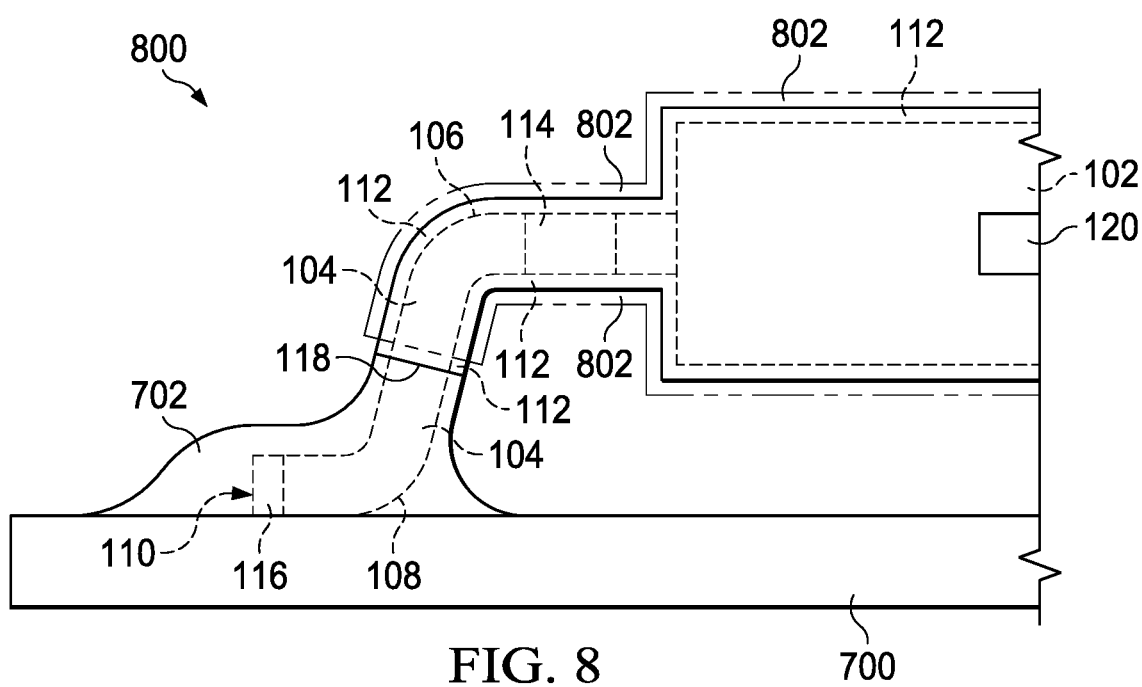

The coated semiconductor device 800 of FIG. 8 is similar to that of FIG. 7, except for the addition of a metallic coat 802 covering (e.g., abutting) an insulative coat 112. Specifically, the metallic coat 802 (e.g., aluminum, nickel, titanium, copper, tungsten) covers the portions of the insulative coat 112 that cover the mold compound housing 102.

In examples, the metallic coat 802 covers some of the insulative coat 112 that covers the conductive terminal 104. For instance, as shown, the metallic coat 802 extends from the mold compound housing 102 to a point closer to the mold compound housing 102 than the point 118. In other examples, the metallic coat 802 extends to the point 118. In examples, the metallic coat 802 does not make direct contact with the conductive terminal 104 or the metal joint 702 to avoid causing a short circuit. The metallic coat 802 provides the advantages of metallic coats described above.

Figure 9:
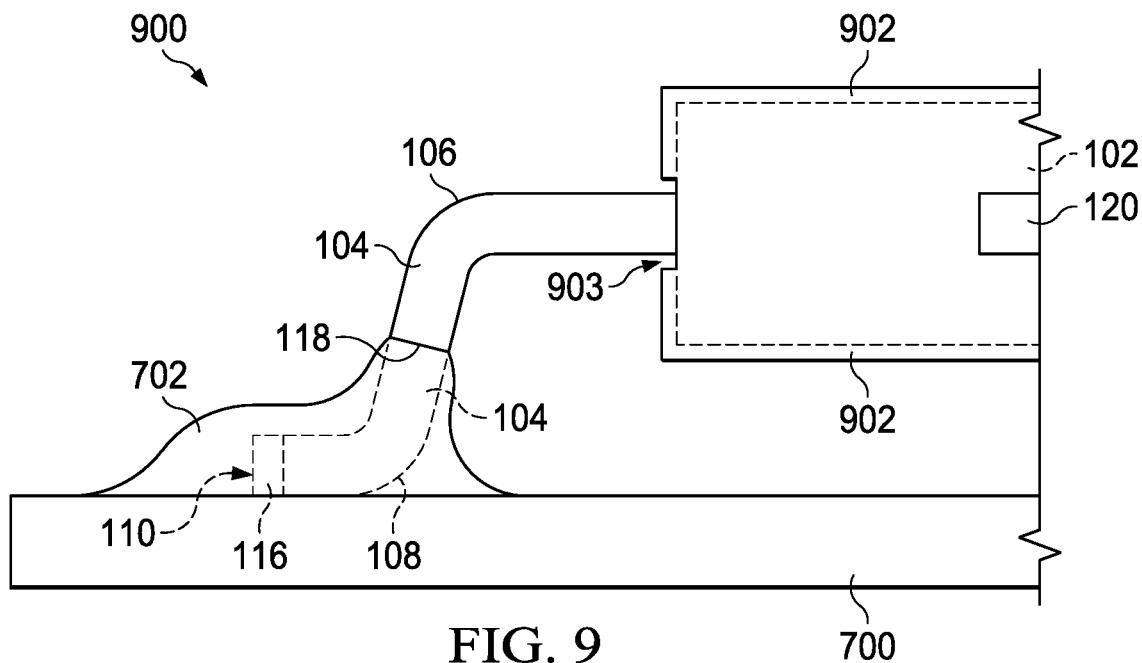

FIG. 9 depicts a coated semiconductor device 900 comprising the mold compound housing 102 and the conductive terminal 104 extending from the mold compound housing 102. In addition, the coated semiconductor device 900 includes a coat 902 (e.g., an insulative coat or metallic coat) covering the mold compound housing 102. In examples, the coat 902 does not cover the conductive terminal 104. In examples, the conductive terminal 104 does not include an exposed area in which the copper underlying the plating is exposed due to dam bar cuts. This is because in such examples, the conductive terminal 104 is plated after the dam bar cuts, thereby covering any such exposed areas with plating. The metal joint 702 covers the bend 108 and the exposed area 116 at the end 110. The metal joint 702 provides the advantages described above. The coat 902 provides the advantages described above for the mold compound housing 102, for example, mitigation of moisture ingress into the mold compound housing 102, blocking of EMF in the case of a metallic coat 902, etc. A notch 903 prevents contact between the conductive terminal 104 and the coat 902 in case the coat 902 is a metallic coat. However, if the coat 902 is an insulative coat, the notch 903 is not needed, and the coat 902 may or may not abut the conductive terminal 104.

Figure 10:
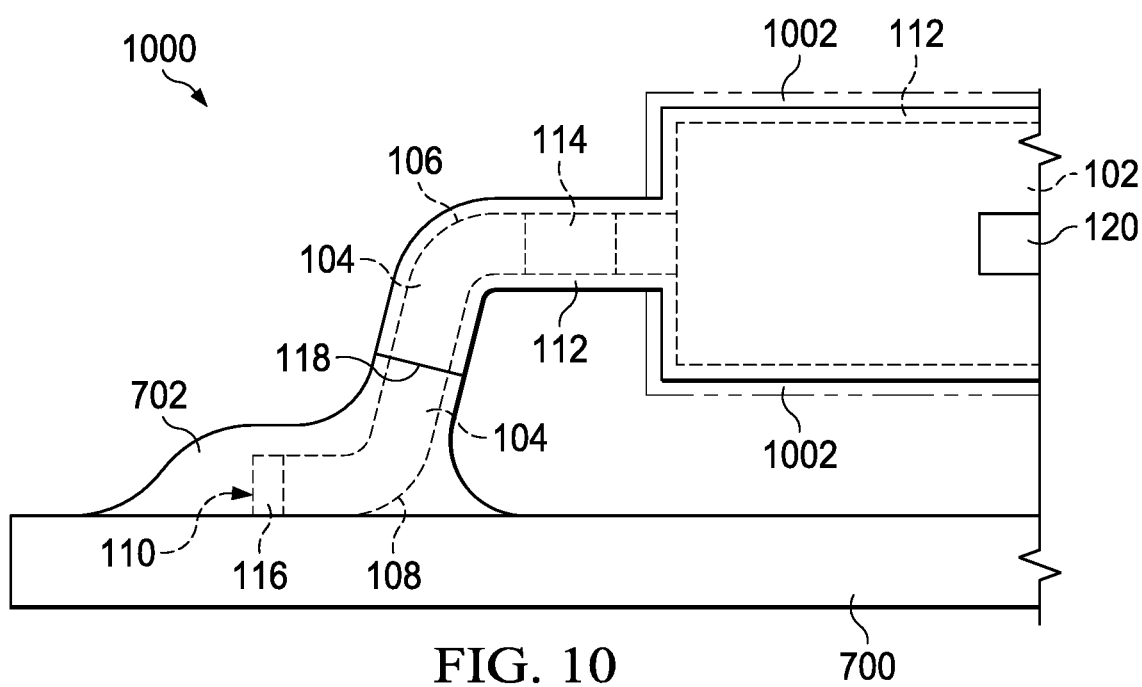

The coated semiconductor device 1000 of FIG. 10 is similar to that of FIG. 8, except that a metallic coat 1002 covers an insulative coat 112 in the manner shown. Specifically, the metallic coat 1002 covers the portions of the insulative coat 112 that cover the mold compound housing 102. However, as shown, the metallic coat 1002 does not extend along the length of the conductive terminal 104 toward the end 110. The advantages of the metallic coat 1002 and the insulative coat 112 are described above.

Although the descriptions of FIGS. 7-10 reference the advantages of insulative and metallic coats, the advantages of the different configurations of FIGS. 7-10 relative to each other are now provided. Relative to the configurations of FIGS. 8-10, the configuration of FIG. 7 may find useful application when a low-cost technique for achieving the benefits of insulative coating is desired without the need for blocking EMF, and when plating of the conductive terminals 104 is performed prior to the dam bar cutting process, thus leaving exposed areas 114 that expose underlying copper. Relative to the configurations of FIGS. 7, 9, and 10, the configuration of FIG. 8 may find useful application when the benefits of FIG. 7 are desired and, in addition, EMF blocking is desired. In such cases, the metallic coat 802 provides such EMF blocking. Relative to the configurations of FIGS. 7, 8, and 10, the configuration of FIG. 9 may find useful application when the conductive terminals 104 are plated after the dam bar cutting process, so that the underlying copper is not exposed at areas where the dam bars were cut. Further, the configuration of FIG. 9 may find useful application when either the benefits of EMF blocking are unnecessary (in which case the coat 902 is an insulative coat) or the benefits of an insulative coat are unnecessary, but EMF blocking is desired (in which case the coat 902 is a metallic coat). Relative to the configurations of FIGS. 7-9, the configuration of FIG. 10 may find useful application when EMF blocking is desired, but for one or more reasons (e.g., cost), the metallic coat 1002 covering the areas shown in FIG. 10 is sufficient, without additional covering along the length of the conductive terminal 104 toward the end 110.

The descriptions of FIGS. 7-10 above are provided in the context of a single conductive terminal 104. The same descriptions may apply to multiple conductive terminals 104 of a given semiconductor device (e.g., semiconductor package).

FIGS. 11A1-11F1 depict top-down views of a process flow for manufacturing a coated semiconductor device, in accordance with examples. FIGS. 11A2-11F2 depict perspective views of a process flow for manufacturing a coated semiconductor device, in accordance with examples. Thus, FIGS. 11A1-11F1 and 11A2-11F2 are now described in tandem.

In FIG. 11A1, a leadframe strip 1100 includes conductive terminals 104 (e.g., leads), dam bars 1102, and tie bars 1104. FIGS. 11A1-11F1 and 11A2-11F2 assume that the leadframe strip 1100 has already been plated, e.g., using tin or nickel palladium gold in an electroplating process. In this example, the mold injection process has already been completed, so the mold compound housing 102 covers a semiconductor die, a die pad, bond wires, etc., none of which are expressly depicted in FIG. 11A1. FIG. 11A2 depicts a perspective view of the structure of FIG. 11A1.

FIG. 11B1 depicts the same structure as FIG. 11A1, except that the dam bars 1102 have been cut in between the conductive terminals 104. Cutting the dam bars 1102 causes the copper (or other metal) underlying the plating to be exposed and thus risks corrosion. FIG. 11B2 depicts a perspective view of the structure of FIG. 11B1.

Figure 12A:
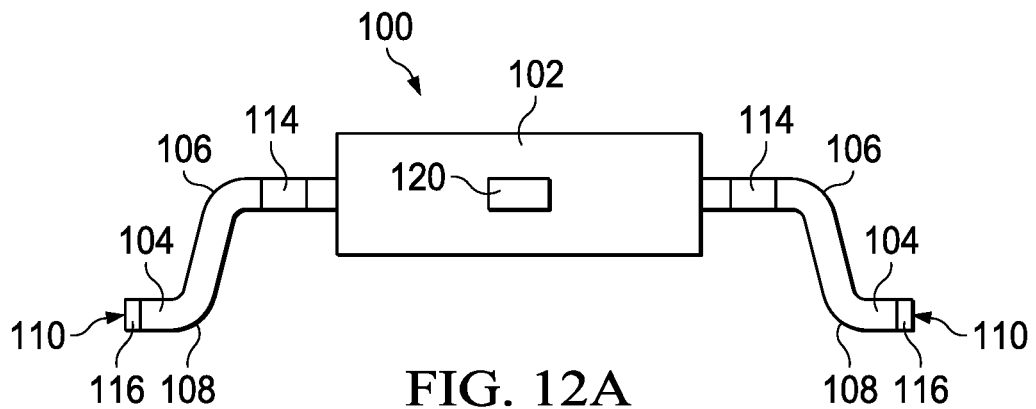
FIGS. 12A-12C, 13, and 14 depict various views of a process flow for coating a semiconductor device, in accordance with examples.
Figure 12B:
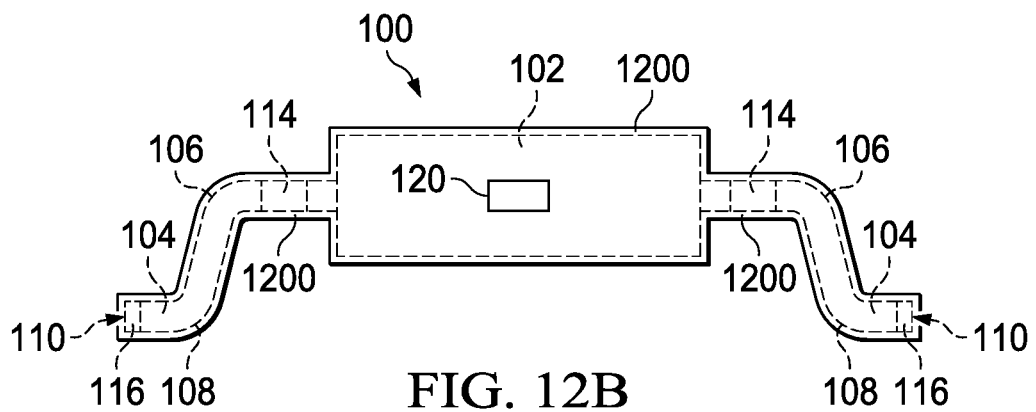
Figure 12C:
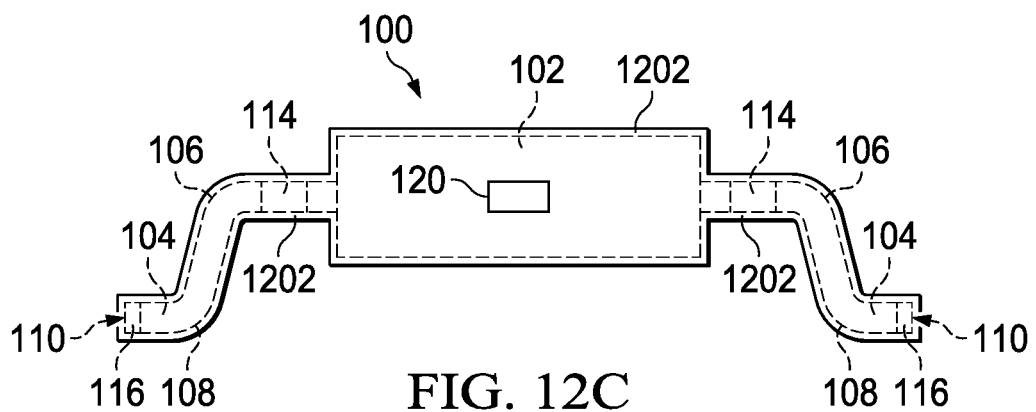

FIG. 11C1 depicts the same structure as FIG. 11B1, except that the coat 1202 has been applied to the leadframe strip 1100 and the mold compound housing 102. FIG. 11C2 depicts a perspective view of the structure of FIG. 11C1. The coating process is now described with brief reference to FIGS. 12A-12C. This disclosure assumes that the coating process is performed after the dam bar cuts of FIGS. 11B1 and 11B2, but prior to the conductive terminal cuts. However, the coating process may be performed at any suitable time, for example, prior to the dam bar cuts (e.g., while the leadframe is still intact and coupled to the leadframe strip and the mold compound housing has been applied), after the conductive terminal (e.g., lead) cuts, after the conductive terminal forming process during which the bends 106 and/or 108 are introduced, after the tie bars are cut, etc. Despite the assumption that the coating process is performed after the dam bar cuts and prior to conductive terminal cuts, FIGS. 12A-12C omit depiction of the leadframe strip 1100 for simplicity and clarity. In FIG. 12A, the mold compound housing 102 is cleaned and baked to remove moisture from inside the mold compound housing 102 and on the surface of the mold compound housing 102. In FIG. 12B, a coating material 1200 is applied to the mold compound housing 102 and the conductive terminals 104. The coating material 1200 may be insulative material (e.g., polymer, solder resist, ceramic) or metallic. The coating material 1200 may be applied using a spray technique or a dipping technique. In FIG. 12C, the coating material 1200 is partially cured, meaning that the resulting partially cured coat 1202 is still malleable. The description of FIGS. 11D1-11F1 and 11D2-11F2 is now resumed.

In FIG. 11D1, the structure shown is the same as that in FIG. 11C1, except that the conductive terminals 104 are cut from the leadframe strip 1100. In examples, the plating process is performed on the leadframe strip 1100, before a semiconductor die or other components are coupled to the leadframe strip 1100. However, in examples, the plating process is performed at other times. Preferably, the plating process is performed prior to the conductive terminals 104 being cut, as the cutting of these terminals reduces current flow paths and makes plating more difficult and time-consuming. FIG. 11D2 provides a perspective view of the structure of FIG. 11D1.

In FIG. 11E1, the structure shown is the same as that in FIG. 11D1, except that the conductive terminals 104 are bent to produce one or more bends 106, 108. Any cracking of the conductive terminals 104 that occurs due to the bending process will be covered by the coat 1202, thereby preventing corrosion of the copper underlying the plating in the conductive terminals 104. In addition, the coat 1202 will prevent whisker formation at the one or more bends 106, 108. FIG. 11E2 provides a perspective view of the structure of FIG. 11E1.

In FIG. 11F1, the structure shown is the same as that of FIG. 11E1, except that the tie bars 1104 are cut. To prevent the resulting tabs 120 from being exposed, the tabs 120 may be spray coated with the coating material 1200 described above, or the structure may be dipped in the coating material a second time. Alternatively, if the structure has not yet been coated, the structure may be dipped in the coating material for the first time after the tie bars 1104 are cut. Any and all such possibilities for the timing of the coating are contemplated and included in the scope of this disclosure. FIG. 11F2 depicts a perspective view of the structure of FIG. 11F1.

Figure 13:
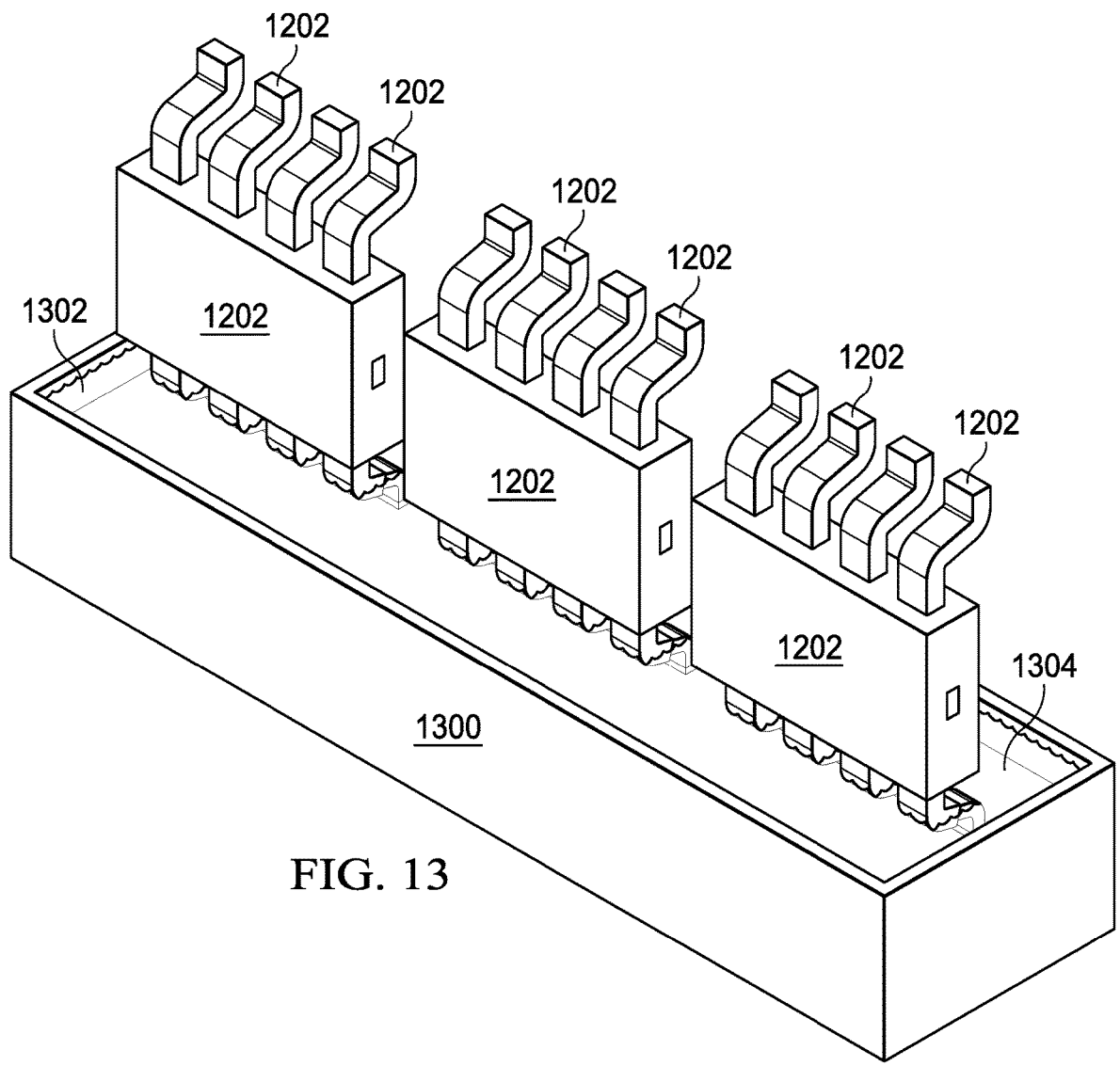
Figure 14:
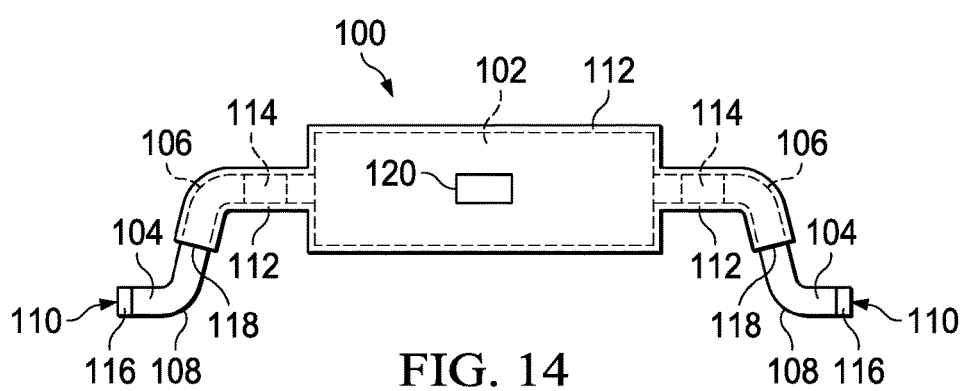

To produce the structure of, e.g., FIGS. 1A-1C, the partially cured coat 1202 should be removed from the distal portions of the conductive terminals 104. The partially cured coat 1202 may be removed using, e.g., a solvent, such as acetone, benzene, oleic acid, butane, etc. Referring to FIG. 13, in some examples, the semiconductor device having a partially cured coat 1202 is dipped in a tank 1300 containing solvent 1302. Specifically, the portions of the partially cured coat 1202 that are to be removed are dipped in the solvent 1302. In examples, the depth of the tank 1300 is adjusted (e.g., using a pedestal 1304) so that, when a row of conductive terminals 104 is dipped as far as possible into the solvent 1302, only the desired portions of the partially cured coat 1202 are exposed to the solvent 1302 and stripped away. Similarly, other rows of conductive terminals 104 (e.g., opposing the row of conductive terminals 104 already dipped into the solvent 1302) may be dipped into the solvent 1302 after rotating the semiconductor device so that the desired portions of the partially cured coat 1202 are removed from those conductive terminals 104. The resulting structure lacks the partially cured coat 1202 on multiple conductive terminals 104 in the precise configuration desired. The remaining partially cured coat 1202 is then cured again such that the partially cured coat 1202 is no longer malleable, thus producing the coat 112. Both partial and final curing are referred to herein as curing. FIG. 14 depicts the coat 112 covering the mold compound housing 102 and proximal portions of the conductive terminals 104.

The process flow described above assumes that the coat 112 is to cover portions of the conductive terminals 104. However, as explained with reference to FIG. 9, in some examples, the conductive terminals 104 are not coated. For such examples, the process flow described above is still applicable, but in such examples, the solvent 1302 may be used on the full or almost-full lengths of the conductive terminals 104, as desired.

Figure 15:
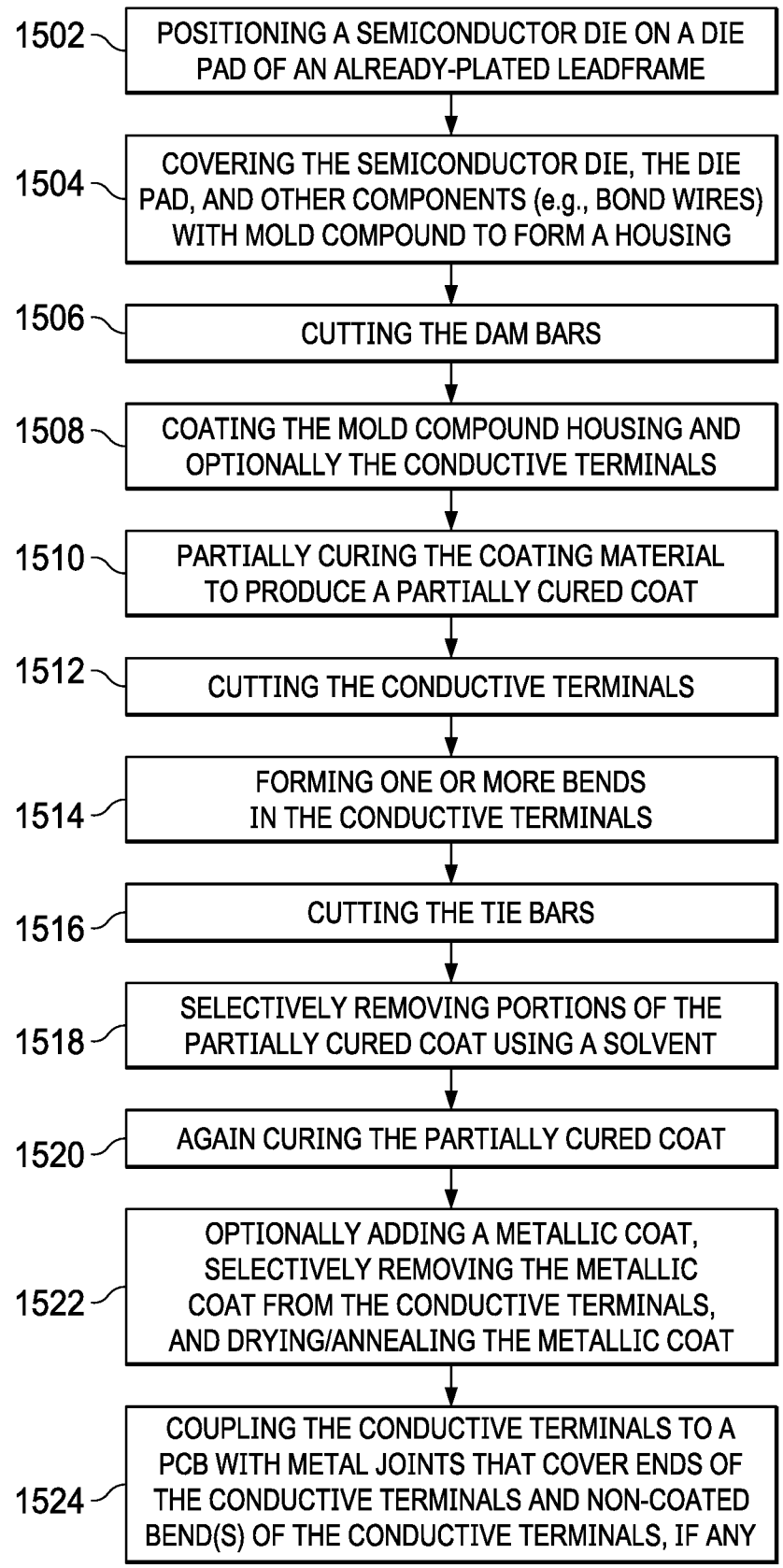
FIG. 15 depicts a flow diagram of a method for manufacturing a coated semiconductor device, in accordance with examples.

FIG. 15 depicts a flow diagram of a method for manufacturing a coated semiconductor device, in accordance with examples. The method comprises positioning a semiconductor die on a die pad of an already-plated leadframe (1502). The method comprises covering the semiconductor die, the die pad, and other components (e.g., bond wires) with a mold compound to form a housing (1504), for instance, as shown in the structure of FIGS. 11A1 and 11A2. The method comprises cutting the dam bars (1506), as shown in the structure of FIGS. 11B1 and 11B2. The method comprises coating the mold compound housing and optionally the conductive terminals (1508), as shown in the structure of FIGS. 11C1, 11C2, and 12B. The method comprises partially curing the coating material to produce a partially cured coat (1510), as depicted in the structure of FIG. 12C. The method comprises cutting the conductive terminals (1512), as shown in the structure of FIGS. 11D1 and 11D2. The method comprises forming one or more bends in each of the conductive terminals (1514), as shown in the structure of FIGS. 11E1 and 11E2. The method comprises cutting the tie bars (1516), as shown in the structure of FIGS. 11F1 and 11F2. The method comprises selectively removing portions of the partially cured coat using a solvent (1518), as shown in FIG. 13. The method comprises again curing the partially cured coat (1520), as depicted in FIG. 14. If the coat is an insulative coat, the method comprises optionally adding a metallic coat, selectively removing the metallic coat from the conductive terminals, and drying/annealing the metallic coat (1522), as depicted in FIGS. 11A1-11F1 and 11A2-11F2. The method comprises coupling the conductive terminals to a PCB with metal joints that cover ends of the conductive terminals and non-coated bend(s) of the conductive terminals, if any (1524), as FIGS. 7-10 depict.

The foregoing examples have primarily been described in the context of insulative coats covering mold compound housings. In examples, however, the described insulative coats may cover any type of encapsulant that is used to cover circuitry (e.g., a semiconductor die) of a semiconductor package.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method, comprising:
providing a semiconductor device having a plastic housing and a conductive terminal extending from the plastic housing;
covering the plastic housing and the conductive terminal with an insulative coat;
performing a first curing of the insulative coat;
using a solvent to remove the insulative coat from a portion of the conductive terminal; and
performing a second curing of the insulative coat covering the plastic housing and the conductive terminal.

2. The method of claim 1, wherein covering the plastic housing and the conductive terminal with the insulative coat comprises coating the plastic housing and the conductive terminal while the semiconductor device is coupled to a leadframe strip.

3. The method of claim 2, further comprising cutting a dam bar coupled to the conductive terminal prior to covering the plastic housing and the conductive terminal with the insulative coat.

4. The method of claim 1, wherein the conductive terminal includes a first bend and a second bend, and wherein, after performing the second curing, the insulative coat remaining on the conductive terminal extends from the plastic housing to a point between the first bend and the second bend.

5. The method of claim 4, further comprising coupling the conductive terminal to a printed circuit board (PCB) using solder, and wherein the solder covers the second bend and an end of the conductive terminal.

6. The method of claim 5, wherein using the solvent to remove the insulative coat from the portion of the conductive terminal comprises dipping the portion of the conductive terminal in the solvent to remove the insulative coat from the portion of the conductive terminal, the method further comprising:
rotating an orientation of the semiconductor device; and
dipping a second portion of a second conductive terminal of the semiconductor device in the solvent or another solvent to remove the insulative coat from the second portion, the conductive terminal and the second conductive terminal positioned on opposing ends of the semiconductor device.

7. The method of claim 1, wherein the insulative coat is selected from the group consisting of: a polymer, a solder resist, and a ceramic.

8. The method of claim 1, wherein the insulative coat has a thickness ranging from 100 nanometers to 10 microns.

9. The method of claim 1, further comprising coating at least a portion of the insulative coat with a metallic coat.

* * * * *